(12) United States Patent
Yang et al.

(10) Patent No.: US 6,911,391 B2
(45) Date of Patent: Jun. 28, 2005

(54) INTEGRATION OF TITANIUM AND TITANIUM NITRIDE LAYERS

(75) Inventors: Michael X. Yang, Palo Alto, CA (US); Toshio Itoh, Palo Alto, CA (US); Ming Xi, Palo Alto, CA (US)

(73) Assignee: Applied Materials, Inc., Sanat Clara, CA (US)

( * ) Notice: Subject to any disclaimer, the term of this patent is extended or adjusted under 35 U.S.C. 154(b) by 66 days.

(21) Appl. No.: 10/118,664

(22) Filed: Apr. 8, 2002

(65) Prior Publication Data

US 2003/0143841 A1 Jul. 31, 2003

Related U.S. Application Data

(60) Provisional application No. 60/352,191, filed on Jan. 26, 2002.

(51) Int. Cl.$^7$ .............................................. H01L 21/44
(52) U.S. Cl. ........................ 438/653; 438/654; 438/656; 438/683
(58) Field of Search ................................ 438/653–656, 438/683

(56) References Cited

U.S. PATENT DOCUMENTS

| | | | |
|---|---|---|---|
| 4,058,430 A | 11/1977 | Suntola et al. ............... | 156/611 |
| 4,389,973 A | 6/1983 | Suntola et al. ............... | 118/725 |
| 4,413,022 A | 11/1983 | Suntola et al. ............ | 427/255.2 |

(Continued)

FOREIGN PATENT DOCUMENTS

| | | | | |
|---|---|---|---|---|
| EP | 0 344 352 A1 | 12/1989 | ........... | H01L/39/24 |
| EP | 0 429 270 A2 | 5/1991 | ............ | G03F/7/36 |
| EP | 0 442 290 A1 | 8/1991 | ........... | C30B/25/02 |

(Continued)

OTHER PUBLICATIONS

Klaus, et al. "Atomic Layer Deposition of SIO$_2$ Using Catalyzed and Uncatalyzed Self–Limiting Surface Reactions," Surface Review and Letters, vol. 6, Nos. 3 & 4 (1999) 435–448.

(Continued)

*Primary Examiner*—Hsien-Ming Lee
(74) *Attorney, Agent, or Firm*—Moser Patterson & Sheridan, LLP

(57) ABSTRACT

Embodiments of the present invention generally relate to an apparatus and method of integration of titanium and titanium nitride layers. One embodiment includes providing one or more cycles of a first set of compounds, providing one or more cycles of a second set of compounds, and providing one or more cycles of a third set of compounds. One cycle of the first set of compounds includes introducing a titanium precursor and a reductant. One cycle of the second set of compounds includes introducing the titanium precursor and a silicon precursor. One cycle of the third set of compounds includes introducing the titanium precursor and a nitrogen precursor. Another embodiment includes depositing a titanium layer utilizing titanium halide. Then, a passivation layer is deposited over the titanium layer utilizing titanium halide. The passivation layer may comprise titanium silicide, titanium silicon nitride, and combinations thereof. Then, a titanium nitride layer is deposited over the passivation layer utilizing titanium halide. Still another embodiment comprises depositing a titanium layer over a surface of a substrate. Then, the titanium layer is treated with a soak with a silicon precursor at a substrate temperature of about 550° C. or less to form a treated titanium layer. Then, a titanium nitride layer is deposited over the treated titanium layer.

24 Claims, 9 Drawing Sheets

U.S. PATENT DOCUMENTS

| | | | |
|---|---|---|---|
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Nishizawa et al. | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,306,666 A | 4/1994 | Izumi | 437/192 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/84 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/641 |
| 5,503,875 A | 4/1996 | Imai et al. | 427/255.3 |
| 5,521,126 A | 5/1996 | Okamura et al. | 437/235 |
| 5,526,244 A | 6/1996 | Bishop | 362/147 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,580,380 A | 12/1996 | Liu et al. | 117/86 |
| 5,595,784 A * | 1/1997 | Kaim et al. | 427/255.391 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | 427/255.23 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,051,286 A | 4/2000 | Zhao et al. | 427/576 |
| 6,057,229 A * | 5/2000 | Hieber et al. | 438/630 |
| 6,062,798 A | 5/2000 | Muka | 414/416 |
| 6,071,808 A | 6/2000 | Merchant et al. | 438/633 |
| 6,081,034 A * | 6/2000 | Sandhu et al. | 257/764 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |

| | | | |
|---|---|---|---|
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 * | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,207,487 B1 | 3/2001 | Kim et al. | 438/238 |
| 6,214,714 B1 * | 4/2001 | Wang et al. | 438/592 |
| 6,231,672 B1 | 5/2001 | Choi et al. | 118/715 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |
| 6,284,646 B1 | 9/2001 | Leem | 438/629 |
| 6,287,965 B1 | 9/2001 | Kang et al. | 438/648 |
| 6,291,876 B1 | 9/2001 | Stumborg et al. | 257/632 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,342,277 B1 | 1/2002 | Nishikawa et al. | 435/128 |
| 6,348,376 B2 | 2/2002 | Lim et al. | 438/253 |
| 6,358,829 B2 | 3/2002 | Yoon et al. | 438/597 |
| 6,372,598 B2 | 4/2002 | Kang et al. | 438/399 |
| 6,391,785 B1 | 5/2002 | Satta et al. | 438/704 |
| 6,399,491 B2 * | 6/2002 | Jeon et al. | 438/680 |
| 6,404,058 B1 * | 6/2002 | Taguwa | 257/770 |
| 6,416,577 B1 | 7/2002 | Suntoloa et al. | 117/88 |
| 6,416,822 B1 | 7/2002 | Chiang et al. | 427/561 |
| 6,428,859 B1 | 8/2002 | Chiang et al. | 427/457 |
| 6,447,607 B2 | 9/2002 | Soininen et al. | 117/200 |
| 6,451,119 B2 | 9/2002 | Sneh et al. | 118/715 |
| 6,451,695 B2 | 9/2002 | Sneh | 438/685 |
| 6,458,701 B1 | 10/2002 | Chae et al. | 438/680 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,733 B2 | 11/2002 | Raaijmakers et al. | 438/633 |
| 6,511,539 B1 | 1/2003 | Raaijmakers | 117/102 |
| 6,534,395 B2 | 3/2003 | Werkhoven et al. | 438/627 |
| 6,548,424 B2 | 4/2003 | Putkonen | 438/785 |
| 6,551,406 B2 | 4/2003 | Kilpi | 118/728 |
| 6,551,929 B1 | 4/2003 | Kori et al. | 438/685 |
| 6,607,976 B2 | 8/2003 | Chen et al. | 438/627 |
| 2001/0000866 A1 | 5/2001 | Sneh et al. | 118/723 R |
| 2001/0002280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0028924 A1 | 10/2001 | Sherman | 427/255.28 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0050039 A1 | 12/2001 | Park | 117/102 |
| 2001/0051215 A1 * | 12/2001 | Arkles et al. | 427/255.36 |
| 2001/0054377 A1 | 12/2001 | Lindfors et al. | 117/104 |
| 2001/0054730 A1 | 12/2001 | Kim et al. | 257/301 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0021544 A1 | 2/2002 | Cho et al. | 361/200 |
| 2002/0031618 A1 | 3/2002 | Sherman | 427/569 |
| 2002/0041931 A1 | 4/2002 | Suntola et al. | 427/255.28 |
| 2002/0043722 A1 * | 4/2002 | Taguwa | 257/758 |
| 2002/0048635 A1 | 4/2002 | Kim et al | 427/331 |
| 2002/0052097 A1 | 5/2002 | Park | 438/507 |
| 2002/0066411 A1 | 6/2002 | Chiang et al. | 118/724 |
| 2002/0068458 A1 | 6/2002 | Chiang et al. | 438/694 |
| 2002/0073924 A1 | 6/2002 | Chiang et al. | 118/723 R |
| 2002/0074588 A1 | 6/2002 | Lee | 257/306 |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0081844 A1 | 6/2002 | Jeon et al. | 438/680 |
| 2002/0086106 A1 | 7/2002 | Park et al. | 427/248.1 |
| 2002/0086111 A1 * | 7/2002 | Byun et al. | 427/255.394 |
| 2002/0092471 A1 | 7/2002 | Kang et al. | 118/715 |
| 2002/0094689 A1 | 7/2002 | Park | 438/694 |
| 2002/0104481 A1 | 8/2002 | Chiang et al. | 118/723 I |
| 2002/0106536 A1 | 8/2002 | Lee et al. | 428/702 |
| 2002/0108570 A1 | 8/2002 | Lindfors | 118/715 |
| 2002/0121241 A1 | 9/2002 | Nguyen et al. | 118/715 |
| 2002/0121342 A1 | 9/2002 | Nguyen et al. | 156/345.33 |
| 2002/0134307 A1 | 9/2002 | Choi | 118/715 |
| 2002/0135071 A1 | 9/2002 | Kang et al. | 257/767 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0192396 A1 * | 12/2002 | Wang et al. | 427/574 |
| 2002/0197402 A1 | 12/2002 | Chiang et al. | 427/255.39 |
| 2003/0004723 A1 | 1/2003 | Chihara | 704/260 |
| 2003/0010451 A1 | 1/2003 | Tzu et al. | 156/345.33 |
| 2003/0013300 A1 | 1/2003 | Byun | 438/680 |
| 2003/0013320 A1 | 1/2003 | Kim et al. | 438/778 |
| 2003/0023338 A1 | 1/2003 | Chin et al. | 700/121 |
| 2003/0031807 A1 | 2/2003 | Elers et al. | 427/569 |
| 2003/0032281 A1 | 2/2003 | Werkhoven et al. | 438/640 |
| 2003/0042614 A1 * | 3/2003 | Deraa et al. | 257/768 |
| 2003/0042630 A1 | 3/2003 | Babcoke et al. | 261/121.1 |
| 2003/0049942 A1 | 3/2003 | Haukka et al. | 438/778 |
| 2003/0054631 A1 | 3/2003 | Raaijmakers et al. | 438/633 |
| 2003/0072975 A1 | 4/2003 | Shero et al. | 428/704 |
| 2003/0075273 A1 | 4/2003 | Kilpela et al. | 156/345.33 |
| 2003/0079686 A1 | 5/2003 | Chen et al. | 118/715 |
| 2003/0082296 A1 | 5/2003 | Elers et al. | 427/96 |
| 2003/0082300 A1 | 5/2003 | Todd et al. | 427/255.27 |
| 2003/0121469 A1 | 7/2003 | Lindfors et al. | 117/105 |
| 2003/0129826 A1 | 7/2003 | Werkhoven et al. | 438/627 |
| 2003/0134508 A1 | 7/2003 | Raaijmakers et al. | 438/638 |
| 2003/0140854 A1 | 7/2003 | Kilpi | 118/715 |
| 2003/0143747 A1 | 7/2003 | Bondestam et al. | 436/34 |
| 2003/0143839 A1 | 7/2003 | Raaijmakers et al. | 438/633 |
| 2003/0143841 A1 | 7/2003 | Yang et al. | 438/656 |
| 2003/0165615 A1 | 9/2003 | Aaltonen et al. | 427/79 |

FOREIGN PATENT DOCUMENTS

| | | | |
|---|---|---|---|
| EP | 0 799 641 A2 | 10/1997 | B01J/20/32 |
| EP | 1167569 | 1/2002 | C23C/16/455 |
| FR | 2.69.2597 | 12/1993 | C23C/16/00 |
| GB | 2 355 727 A | 5/2001 | C23C/16/44 |
| JP | 58-98917 | 6/1983 | H01L/21/205 |
| JP | 58-100419 | 6/1983 | H01L/21/20 |
| JP | 59-098917 | 6/1983 | H01L/21/205 |

| | | | | | | | |
|---|---|---|---|---|---|---|---|
| JP | 61-035847 | 2/1986 | ............ B01J/19/08 | JP | 04-031396 | 2/1992 | ............ C30B/25/14 |
| JP | 61-210623 | 9/1986 | ......... H01L/21/205 | JP | 04-100292 | 4/1992 | ............ H01S/3/18 |
| JP | 62-069508 | 3/1987 | ......... H01L/21/203 | JP | 04-111418 | 4/1992 | ......... H01L/21/205 |
| JP | 62-091495 | 4/1987 | ........... C03B/25/02 | JP | 04-132214 | 5/1992 | ......... H01L/21/205 |
| JP | 62-141717 | 6/1987 | ......... H01L/21/203 | JP | 04-132681 | 5/1992 | ......... C30B/25/14 |
| JP | 62-167297 | 7/1987 | ........... C30B/29/40 | JP | 04-151822 | 5/1992 | ......... H01L/21/205 |
| JP | 62-171999 | 7/1987 | ........... C30B/29/40 | JP | 04-162418 | 6/1992 | ......... H01L/21/205 |
| JP | 62-232919 | 10/1987 | ......... H01L/21/205 | JP | 04-175299 | 6/1992 | ......... C30B/29/68 |
| JP | 63-062313 | 3/1988 | ......... H01L/21/203 | JP | 04-186824 | 7/1992 | ......... H01L/21/205 |
| JP | 63-085098 | 4/1988 | ........... C30B/29/40 | JP | 04-212411 | 8/1992 | ......... H01L/21/203 |
| JP | 63-090833 | 4/1988 | ......... H01L/21/365 | JP | 04-260696 | 9/1992 | ......... C30B/29/40 |
| JP | 63-222420 | 9/1988 | ......... H01L/21/205 | JP | 04-273120 | 9/1992 | ......... H01L/21/20 |
| JP | 63-222421 | 9/1988 | ......... H01L/21/205 | JP | 04-285167 | 10/1992 | ......... C23C/14/54 |
| JP | 63-227007 | 9/1988 | ......... H01L/21/205 | JP | 04-291916 | 10/1992 | ......... H01L/21/205 |
| JP | 63-252420 | 10/1988 | ......... H01L/21/205 | JP | 04-325500 | 11/1992 | ............ C30B/33/00 |
| JP | 63-266814 | 11/1988 | ......... H01L/21/205 | JP | 04-328874 | 11/1992 | ......... H01L/29/804 |
| JP | 64-009895 | 1/1989 | ........... C30B/29/40 | JP | 05-029228 | 2/1993 | ......... H01L/21/205 |
| JP | 64-009896 | 1/1989 | ........... C30B/29/40 | JP | 05-047665 | 2/1993 | ......... H01L/21/205 |
| JP | 64-009897 | 1/1989 | ........... C30B/29/40 | JP | 05-047666 | 2/1993 | ......... H01L/21/205 |
| JP | 64-037832 | 2/1989 | ......... H01L/21/205 | JP | 05-047668 | 2/1993 | ......... H01L/21/205 |
| JP | 64-082615 | 3/1989 | ......... H01L/21/205 | JP | 05-074717 | 3/1993 | ......... H01L/21/205 |
| JP | 64-082617 | 3/1989 | ......... H01L/21/205 | JP | 05-074724 | 3/1993 | ......... H01L/21/205 |
| JP | 64-082671 | 3/1989 | ............ H01L/29/78 | JP | 05-102189 | 4/1993 | ......... H01L/21/336 |
| JP | 64-082676 | 3/1989 | ............ H01L/29/80 | JP | 05-160152 | 6/1993 | ......... H01L/21/336 |
| JP | 01-103982 | 4/1989 | ........... C30B/23/08 | JP | 05-175143 | 7/1993 | ......... H01L/21/205 |
| JP | 01-103996 | 4/1989 | ........... C30B/29/40 | JP | 05-175145 | 7/1993 | ......... H01L/21/205 |
| JP | 64-090524 | 4/1989 | ......... H01L/21/205 | JP | 05-182906 | 7/1993 | ............ H01L/21/20 |
| JP | 01-117017 | 5/1989 | ......... H01L/21/203 | JP | 05-186295 | 7/1993 | ............ C30B/25/02 |
| JP | 01-143221 | 6/1989 | ......... H01L/21/314 | JP | 05-206036 | 8/1993 | ......... H01L/21/205 |
| JP | 01-143233 | 6/1989 | ............ H01L/21/76 | JP | 05-234899 | 9/1993 | ......... H01L/21/205 |
| JP | 01-154511 | 6/1989 | ............ H01L/21/20 | JP | 05-235047 | 9/1993 | ......... H01L/21/338 |
| JP | 01-236657 | 9/1989 | ............ H01L/29/80 | JP | 05-251339 | 9/1993 | ............ H01L/21/20 |
| JP | 01-245512 | 9/1989 | ......... H01L/21/205 | JP | 05-270997 | 10/1993 | ......... C30B/29/68 |
| JP | 01-264218 | 10/1989 | ......... H01L/21/205 | JP | 05-283336 | 10/1993 | ............ H01L/21/20 |
| JP | 01-270593 | 10/1989 | ........... C30B/25/02 | JP | 05-291152 | 11/1993 | ......... H01L/21/205 |
| JP | 01-272108 | 10/1989 | ......... H01L/21/203 | JP | 05-304334 | 11/1993 | ............ H01L/3/18 |
| JP | 01-290221 | 11/1989 | ......... H01L/21/205 | JP | 05-343327 | 12/1993 | ......... H01L/21/205 |
| JP | 01-290222 | 11/1989 | ......... H01L/21/205 | JP | 05-343685 | 12/1993 | ......... H01L/29/784 |
| JP | 01-296673 | 11/1989 | ............ H01L/29/88 | JP | 06-045606 | 2/1994 | ......... H01L/29/784 |
| JP | 01-303770 | 12/1989 | ............ H01L/39/24 | JP | 06-132236 | 5/1994 | ......... H01L/21/205 |
| JP | 01-305894 | 12/1989 | ........... C30B/23/08 | JP | 06/177381 | 6/1994 | ......... H01L/29/784 |
| JP | 01-313927 | 12/1989 | ......... H01L/21/205 | JP | 06-196809 | 7/1994 | ............. H01S/3/18 |
| JP | 02-012814 | 1/1990 | ......... H01L/21/205 | JP | 06-222388 | 8/1994 | ............ G02F/1/136 |
| JP | 02-014513 | 1/1990 | ......... H01L/21/205 | JP | 06-224138 | 8/1994 | ......... H01L/21/205 |
| JP | 02-017634 | 1/1990 | ......... H01L/21/225 | JP | 06-230421 | 8/1994 | ............ G02F/1/136 |
| JP | 02-063115 | 3/1990 | ............ H01L/21/20 | JP | 06-252057 | 9/1994 | ......... H01L/21/205 |
| JP | 02-074029 | 3/1990 | ......... H01L/21/205 | JP | 07-070752 | 3/1995 | ............ C23C/16/40 |
| JP | 02-074587 | 3/1990 | ........... C30B/23/08 | JP | 07-086269 | 3/1995 | ......... H01L/21/314 |
| JP | 02-106822 | 4/1990 | .......... H01B/13/00 | JP | 08-181076 | 7/1996 | ......... H01L/21/205 |
| JP | 02-129913 | 5/1990 | ......... H01L/21/205 | JP | 08-245291 | 9/1996 | ......... C30B/25/14 |
| JP | 02-162717 | 6/1990 | ............ H01L/21/20 | JP | 09-260786 | 10/1997 | ............. H01S/3/18 |
| JP | 02-172895 | 7/1990 | ........... C30B/29/36 | JP | 09-293681 | 11/1997 | ......... H01L/21/205 |
| JP | 02-196092 | 8/1990 | ........... C30B/25/14 | JP | 10-188840 | 7/1998 | ............. H01J/29/18 |
| JP | 02-203517 | 8/1990 | ......... H01L/21/205 | JP | 10-190128 | 7/1998 | ............. H01S/3/18 |
| JP | 02-230690 | 9/1990 | ......... H05B/33/10 | JP | 10-308283 | 11/1998 | ........... H05B/33/22 |
| JP | 02-230722 | 9/1990 | ......... H01L/21/205 | JP | 11-269652 | 10/1999 | ............ C23C/16/44 |
| JP | 02-246161 | 10/1990 | ......... H01/29/784 | JP | 2000-031387 | 1/2000 | ............ H01L/27/04 |
| JP | 02-264491 | 10/1990 | ............ H01S/3/18 | JP | 2000-58777 | 2/2000 | ......... H01L/27/108 |
| JP | 02-283084 | 11/1990 | ............. H01S/3/18 | JP | 2000-058777 | 2/2000 | ......... H01L/27/108 |
| JP | 02-304916 | 12/1990 | ......... H01L/21/205 | JP | 2000-068072 | 3/2000 | ........... H05B/33/22 |
| JP | 03-019211 | 1/1991 | ......... H01L/21/205 | JP | 2000-087029 | 3/2000 | ........... C09K/11/08 |
| JP | 03-022569 | 1/1991 | ......... H01L/29/804 | JP | 2000-319772 | 3/2000 | ............ C23C/16/00 |
| JP | 03-023294 | 1/1991 | ........... C30B/25/18 | JP | 2000-138094 | 5/2000 | ........... H05B/33/10 |
| JP | 03-023299 | 1/1991 | ........... C30B/29/40 | JP | 2000-218445 | 8/2000 | .............. B23P/6/00 |
| JP | 03-044967 | 2/1991 | ............ H01L/29/48 | JP | 2000-319772 | 11/2000 | ............ C23C/14/24 |
| JP | 03-070124 | 3/1991 | ......... H01L/21/205 | JP | 2001-020075 | 11/2000 | ............ C23C/16/44 |
| JP | 03-185716 | 8/1991 | ......... H01L/21/205 | JP | 2000-340883 | 12/2000 | ........... H01S/5/125 |
| JP | 03-208885 | 9/1991 | ........... C30B/23/02 | JP | 2000-353666 | 12/2000 | ......... H01L/21/205 |
| JP | 03-234025 | 10/1991 | ......... H01L/21/318 | JP | 2001-020075 | 1/2001 | ............ C23C/16/44 |
| JP | 03-286522 | 12/1991 | ......... H01L/21/205 | JP | 2001-152339 | 6/2001 | ............ C23C/16/40 |
| JP | 04-031391 | 2/1992 | ........... C30B/23/08 | JP | 2001-172767 | 6/2001 | ............ C23C/16/40 |

| | | | | |
|---|---|---|---|---|
| JP | 2001-189312 | 7/2001 | ......... | H01L/21/316 |
| JP | 2001-217206 | 8/2001 | ......... | H01L/21/285 |
| JP | 2001-220287 | 8/2001 | ........... | C30B/25/02 |
| JP | 2001-220294 | 8/2001 | ........... | C30B/29/20 |
| JP | 2001-240972 | 9/2001 | ........ | C23C/16/458 |
| JP | 2001-254181 | 9/2001 | ........... | C23C/16/46 |
| JP | 2001-284042 | 10/2001 | ........... | H05B/33/04 |
| JP | 2001-303251 | 10/2001 | ........... | C23C/16/44 |
| JP | 2001-328900 | 11/2001 | ........... | C30B/29/68 |
| JP | 2001-111000 | 12/2002 | ........... | H01L/21/02 |
| WO | 90/02216 | 3/1990 | ........... | C23C/14/34 |
| WO | 91/10510 | 7/1991 | ........... | B01J/37/02 |
| WO | 93/02111 | 2/1993 | ............. | C08F/4/78 |
| WO | 96/17107 | 6/1996 | ........... | C23C/16/44 |
| WO | 96/18756 | 6/1996 | ........... | C23C/16/08 |
| WO | 98/06889 | 2/1998 | | |
| WO | 98/51838 | 11/1998 | ........... | C23C/16/06 |
| WO | 99/01595 | 1/1999 | ........... | C30B/25/14 |
| WO | 99/41423 | 8/1999 | | |
| WO | 99/65064 | 12/1999 | ........... | H01L/21/00 |
| WO | 00/11721 | 3/2000 | ........... | H01L/29/43 |
| WO | 00/15865 | 3/2000 | ........... | C23C/16/00 |
| WO | 00/15881 A2 | 3/2000 | | |
| WO | 00/16377 A2 | 3/2000 | | |
| WO | 00/54320 A1 | 9/2000 | ........... | H01L/21/44 |
| WO | 00/63957 A1 | 10/2000 | ........ | H01L/21/205 |
| WO | 00/79019 A1 | 12/2000 | ........... | C23C/16/00 |
| WO | 00/79576 A1 | 12/2000 | ........ | H01L/21/205 |
| WO | 01/15220 | 3/2001 | ........ | H01L/21/768 |
| WO | 01/17692 | 3/2001 | ........... | B05C/11/00 |
| WO | 01/27346 A1 | 4/2001 | ........... | C23C/16/44 |
| WO | 01/27347 A1 | 4/2001 | ........... | C23C/16/44 |
| WO | 01/29280 A1 | 4/2001 | ........... | C23C/16/32 |
| WO | 01/29891 A1 | 4/2001 | ........ | H01L/21/768 |
| WO | 01/29893 A1 | 4/2001 | ........ | H01L/21/768 |
| WO | 01/36702 A1 | 5/2001 | ........... | C23C/16/00 |
| WO | 01/40541 A1 | 6/2001 | ........... | C23C/16/40 |
| WO | 01/66832 A2 | 9/2001 | ........... | C30B/25/14 |
| WO | 01/01628 A2 | 1/2002 | ........ | H01L/21/768 |
| WO | 02/08488 A1 | 1/2002 | ........... | C23C/16/44 |
| WO | 02/067319 | 8/2002 | ........ | H01L/21/768 |

OTHER PUBLICATIONS

Rossnagel, et al. "Plasma–enhanced Atomic Layer Deposition of Ta and Ti for Interconnect Diffusion Barriers," J. Vacuum Sci. & Tech. B., vol. 18, No. 4 (Jul. 2000), pp. 2016–2020. Ritala, et al. "Surface Roughness Reduction in Atomic Layer Epitaxy Growth of Titanium Dioxide Thin Films," Thin Solid–Films, vol. 249, No. 2 (Sep. 15, 1994), pp. 155–162.

Ritala, et al. "Atomic Force Microscopy Study of Titanium Dioxide Thin Films Grown by Atomic Layer Epitaxy," Thin Solid Films, vol. 228, No. 1–2, (May 15, 1993), pp. 32–35.

Ritala, et al. "Growth of Titanium Dioxide Thin Films by Atomic Layer Epitaxy," Thin Solid Films, vol. 225, No. 1–2 (Mar. 25, 1993) pp. 288–295.

Ritala, et al. "Effects of Intermediate Zinc Pulses on Properties of TiN and NbN Films by Atomic Layer Epitaxy," Applied Surface Science, vol. 120, No. 3–4, (Dec. 1997), pp. 199–212.

Ritala, et al. "Atomic Layer Epitaxy Growth of TiN Thin Films From $TiI_4$ and $NH_3$," J. Electrochem. Soc., vol. 145, No. 8 (Aug., 1998) pp. 2914–2920.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122–2128.

Proceedings of the ICEEE 1998 International Interconnect Technology Conference—San Francisco, California, Jun. 1–3, 1998.

Hultman, et al., "Review of the thermal and mechanical stability of TiN–based thin films", Zeitschrift Fur Metalkunde, 90(10) (Oct. 1999), pp. 803–813.

Klaus, et al., "Atomic Layer Deposition of $SiO_2$ Using Catalyzed and Uncatalyzed Self–Limiting Surface Reactions", Surface Review & Letters, 6(3&4) (1999), pp. 435–448.

Yamaguchi, et al., "Atomic–layer chemical–vapor–deposition of silicon dioxide films with extremely low hydrogen content", Appl. Surf. Sci., vol. 130–132 (1998), pp. 202–207.

George, et al., "Surface Chemistry for Atomic Layer Growth", J. Phys. Chem., vol. 100 (1996), pp. 13121–13131.

George, et al., "Atomic layer controlled deposition of $SiO_2$ and $Al_2O_3$ using ABAB . . . binary reaction sequence chemistry", Appl. Surf. Sci., vol. 82/83 (1994) pp. 460–467.

Wise, et al., "Diethyldiethoxysilane as a new precursor for $SiO_2$ growth on silicon", Mat. Res. Soc. Symp. Proc., vol. 334 (1994), pp. 37–43.

Niinisto, et al., "Synthesis of oxide thin films and overlayers by atomic layer epitaxy for advanced applications", Mat. Sci. & Eng., vol. B41 (1996), pp. 23–29.

Ritala, et al., "Perfectly conformal TiN and $Al_2O_3$ films deposited by atomic layer deposition", Chemical Vapor Deposition, vol. 5(1) (Jan. 1999), pp. 7–9.

Klaus, et al., "Atomically controlled growth of tungsten and tungsten nitride using sequential surface reactions", Appl. Surf. Sci., vol. 162–163 (Jul. 1999), pp. 479–491.

Min, et al., "Atomic layer deposition of TiN thin films by sequential introduction of Ti precursor and $NH_3$", Symp.: Advanced Interconnects and Contact Materials and Processes for Future Integrated Circuits (Apr. 13–16, 1998), pp. 337–342.

Min, et al., "Metal–Organic Atomic–Layer Deposition of Titanium–Silicon–Nitride Films", Applied Physics Letters, American Inst. of Physics, vol. 75(11) (Sep. 13, 1999).

Maertensson, et al., "Atomic Layer Epitaxy of Copper on Tantalum", Chemical Vapor Deposition, 3(1) (Feb. 1, 1997), pp. 45–50.

Ritala, et al. "Atomic Layer Epitaxy Growth of TiN Thin Films", J. Electrochem. Soc., 142(8) (Aug. 1995), pp. 2731–2737.

Elers, et al., "$NbCl_5$ as a precursor in atomic layer epitaxy", Appl. Surf. Sci., vol. 82/83 (1994), pp. 468–474.

Lee, "The Preparation of Titanium–Based Thin Film by CVD Using Titanium Chlorides as precursors", Chemical Vapor Deposition, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/$H_2$ Process", J. Electrochem. Soc. , 145(8) (Aug. 1998), pp. 2926–2931.

Min, et al., "Chemical Vapor Deposition of Ti–Si–N Films with Alternating Source Supply", Mat. Res. Soc. Symp. Proc., vol. 564 (Apr. 5, 1999), pp. 207–210.

Bedair, "Atomic layer epitaxy deposition processes", J. Vac. Sci. Technol. 12(1) (Jan./Feb. 1994).

Yamaga, et al., "Atomic layer epitaxy of ZnS by a new gas supplying system in a low–pressure metalorganic vapor phase epitaxy", J. of Crystal Growth 117 (1992), pp. 152–155.

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filling by 450° C–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., KJ. Vac. Sci. & Tech., 18(4) (Jul. 2000).

pg,23

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition of semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor deposited titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

Maydan, "Cluster Tools for Fabrication of Advanced devices" Jap. J. of Applied Physics, Extended Abstracts, $22^{nd}$ Conference Solid State Devices and Materials (1990), pp. 849–852 XP000178141.

Derbyshire, "Applications of Integrated processing", Solid State Technology, US, Cowan Pub., vol. 37, No. 12 (Dec. 1, 1994), pp. 45–47.

Kitagawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2001), pp. 1–2) (Copy not available to applicant at this time).

Min, et al. "Atomic Layer Deposition of TiN Thin Films by Sequential Introduction of Ti Precursor and $HN_3$," Mat. Res. Soc. Symp. Proc. vol. 514, 1998.

Hwang, et al. "Nanometer–Size $\alpha$–$PbO_2$–Type $TiO_2$ in Garnet: A Thermobarometer for Ultrahigh–Pressure Metamorphism," Science, vol. 288., Apr. 14, 2000.

* cited by examiner

INTEGRATION OF TITANIUM AND TITANIUM NITRIDE LAYERS

CROSS-REFERENCE TO RELATED APPLICATIONS

This application claims benefit of U.S. provisional patent application Ser. No. 60/352,191, filed Jan. 26, 2002, which is herein incorporated by reference.

BACKGROUND OF THE INVENTION

1. Field of the Invention

Embodiments of the present invention generally relate to an apparatus and method of integration of titanium and titanium nitride layers.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between them, decrease to sub-micron dimensions (e.g., 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1. Therefore, there is a great amount of ongoing effort being directed at the formation of substantially void-free and seam-free sub-micron features having high aspect ratios.

In the manufacture of integrated circuits, a titanium/titanium (Ti/TiN) film stack, a titanium nitride layer over a titanium layer, is often used as a liner barrier. For example, Ti/TiN film stack may be used to provide contacts to the source and drain of a transistor. For example, a Ti layer is deposited over a silicon substrate. A portion of the Ti layer, which is in contact with the silicon substrate, is converted to titanium silicide ($TiSi_x$) in situ or in an annealing step. A TiN layer is deposited over the Ti layer. The titanium nitride layer is used as a barrier layer to inhibit the diffusion of metals into regions underlying the barrier layer. A metal layer, such as a tungsten (W) layer, is deposited over the TiN layer.

A Ti layer and a TiN layer may be formed by chemical vapor deposition and/or physical vapor deposition techniques. One example of forming a Ti Layer by chemical vapor deposition includes reacting titanium tetrachloride ($TiCl_4$) with a hydrogen plasma. One example of forming a TiN layer by chemical vapor deposition includes reacting $TiCl_4$ with a nitrogen reactant, such as a nitrogen plasma or ammonia ($NH_3$). One problem with the use of $TiCl_4$-based chemistry used to form a TiN layer over a Ti layer is that reliability problems can occur. In particular, the TiN layer may have poor adhesion over the Ti layer, resulting in peeling of the TiN layer off the Ti layer.

Therefore, there is a need for an improved apparatus and method of integration of titanium and titanium nitride layers.

SUMMARY OF THE INVENTION

Embodiments of the present invention generally relate to an apparatus and method of integration of titanium and titanium nitride layers. One embodiment includes providing one or more cycles of a first set of compounds, providing one or more cycles of a second set of compounds, and providing one or more cycles of a third set of compounds. One cycle of the first set of compounds includes introducing a titanium precursor and a reductant. One cycle of the second set of compounds includes introducing the titanium precursor and a silicon precursor. One cycle of the third set of compounds includes introducing the titanium precursor and a nitrogen precursor. Another embodiment includes depositing a titanium layer utilizing titanium halide. Then, a passivation layer is deposited over the titanium layer utilizing titanium halide. The passivation layer may comprise titanium silicide, titanium silicon nitride, and combinations thereof. Then, a titanium nitride layer is deposited over the passivation layer utilizing titanium halide. Still another embodiment comprises depositing a titanium layer over a surface of a substrate. Then, the titanium layer is treated with a soak with a silicon precursor at a substrate temperature of about 550° C. or less to form a treated titanium layer. Then, a titanium nitride layer is deposited over the treated titanium layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Formation of a $TiSi_x$ and/or a $TiSi_xN_y$ Film

Figure 1:
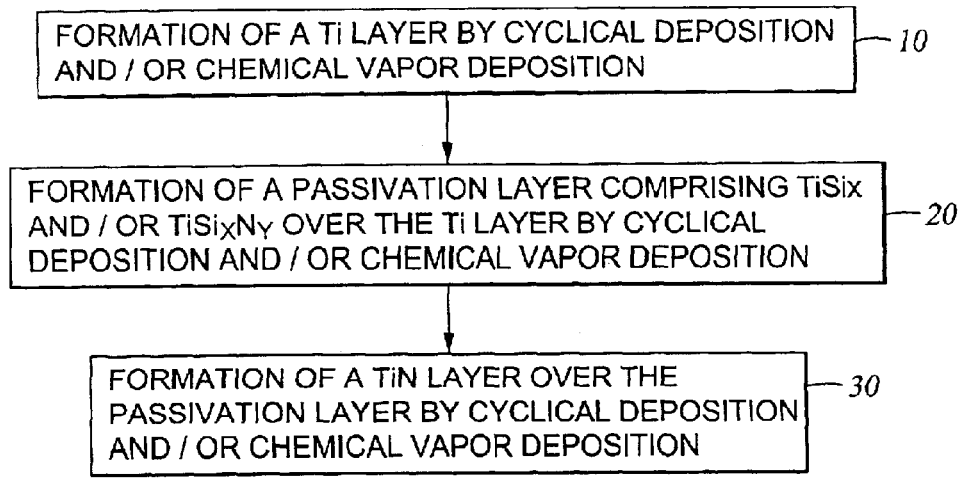
FIG. 1 is a flow chart illustrating one embodiment of a process of integrating a titanium layer and a titanium nitride layer by forming a titanium silicide layer and/or a titanium silicon nitride layer between the titanium layer and the titanium nitride layer.

FIG. 1 is a flow chart illustrating one embodiment of a process of integrating a titanium (Ti) layer and a titanium nitride (TiN) layer by forming a titanium silicide ($TiSi_x$) layer and/or a titanium silicon nitride ($TiSi_xN_y$) layer between the Ti layer and the TiN layer. In step 10, a Ti layer may be formed over a substrate structure by cyclical deposition, chemical vapor deposition, or a combined mode of cyclical deposition and chemical vapor deposition. In step 20, a passivation layer comprising titanium silicide and/or titanium silicon nitride may be formed over the Ti layer by cyclical deposition, chemical vapor deposition, or a combined mode of cyclical deposition and chemical vapor deposition. In step 30, a TiN layer may be formed over the passivation layer by cyclical deposition, chemical vapor deposition, or a combined mode of cyclical deposition and chemical vapor deposition.

Not wishing to be bound by theory, it is believed that the $TiSi_x$ layer or $TiSi_xN_y$ helps protect the interface between the Ti layer and a subsequently deposited TiN layer resulting in improved adhesion of the TiN layer thereover. In the embodiment in which TiN is deposited utilizing a titanium halide, it is believed that the $TiSi_x$ layer or $TiSi_xN_y$ reduces the attack of the halide from the titanium halide used during deposition of TiN and thus provides a Ti/TiN film stack with improved adhesion.

The term "substrate structure" as used herein is intended to include any workpiece upon which film processing is performed and may be used to denote a substrate, such as a semiconductor substrate or a glass substrate, as well as other material layers formed on the substrate, such as a dielectric layer. The term "cyclical deposition" as used herein refers to the sequential introduction of one or more compounds to deposit a thin layer over a structure and includes processing techniques such as atomic layer deposition. Compounds can be reactants, reductants, precursors, catalysts, and mixtures thereof. Sequentially providing compounds may result in the adsorption of thin layers of the compounds over a substrate structure. The sequential introduction of compounds may be repeated to deposit a plurality of thin layers forming a conformal layer to a desired thickness. The terms "adsorption" and "adsorb" as used herein are defined to include chemisorption, physisorption, or any attractive and/or bonding forces which may be at work and/or which may contribute to the bonding, reaction, adherence, or occupation of a portion of a surface of a substrate structure. The term "chemical vapor deposition" as used herein refers to deposition of materials in a primarily gas-phase and/or thermal co-reaction of compounds to form a layer and includes plasma enhanced and non-enhanced processes. A mode of deposition combining cyclical deposition and chemical vapor deposition may also be performed.

Figure 2A:
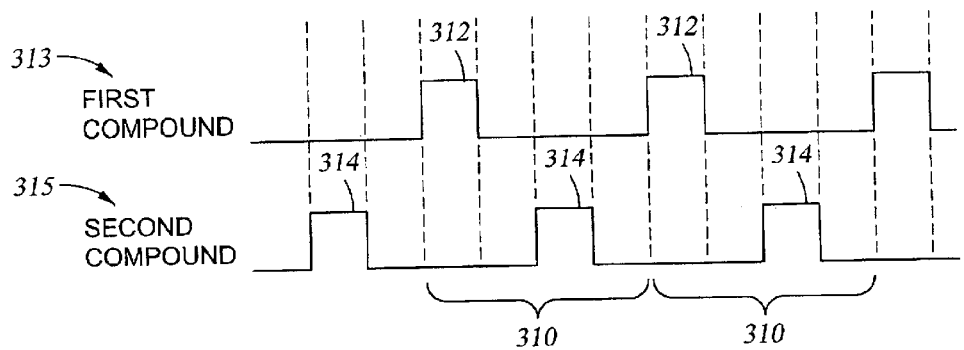
FIG. 2A is a graph of the control signals of an exemplary process for cyclical deposition of a material.

FIG. 2A is a graph of the control signals of an exemplary process for cyclical deposition of a material. One cycle 310 comprises introducing a pulse 312 of a first compound 313 into a chamber by opening and closing a valve providing the first compound. After the pulse of the first compound, a pulse 314 of a second compound 315 is introduced into the chamber by opening and closing a valve providing the second compound. The cycle 310 may be repeated to deposit a desired thickness of the material. The pulses 312 of the first compound 313 and the pulses 314 of the second compound 315 may be delivered with or without a carrier gas. Examples of carrier gases which may be used include, but are not limited to, helium (He), argon (Ar), nitrogen ($N_2$), hydrogen ($H_2$), and mixtures thereof. In one embodiment, the pulses 312 of the first compound 313 and the pulses 314 of the second compound 315 may be dosed into a continuous flow of a purge gas. Examples of purge gases which may be used include, but are not limited to, helium (He), argon (Ar), nitrogen ($N_2$), hydrogen ($H_2$), and mixtures thereof. In other embodiments, pulses 312 of the first compound 313 and pulses 314 of the second compound 315 may be separated by pulses of a purge gas. In still other embodiments, pulses 312 of the first compound 313 and pulses 314 of a second compound 315 may be separated by pump evacuation alone. In other embodiments, cyclical deposition comprises providing pulses of more than two compounds.

Figure 2B:
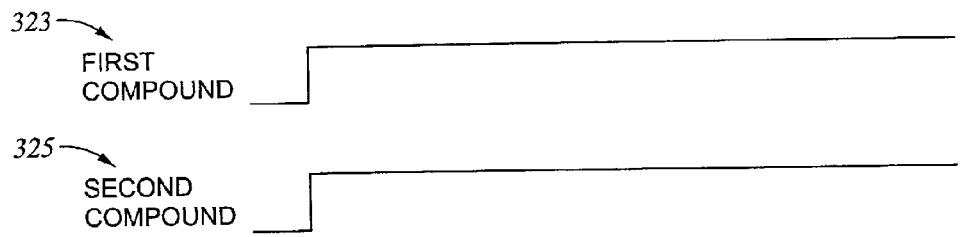
FIG. 2B is a graph of the control signals of one exemplary process for chemical vapor deposition of a material.

FIG. 2B is a graph of the control signals of one exemplary process for chemical vapor deposition of a material. Chemical vapor deposition of a material may comprise introducing a first compound 323 and a second compound 325 simultaneously to a chamber by opening a valve providing the first compound and by opening a valve providing the second compound. The first compound and the second may be delivered with or without a carrier gas. Examples of carrier gases which may be used include, but are not limited to, helium (He), argon (Ar), nitrogen ($N_2$), hydrogen ($H_2$), and mixtures thereof. In other embodiments, chemical vapor deposition comprises providing more than two compounds.

Figure 2C:
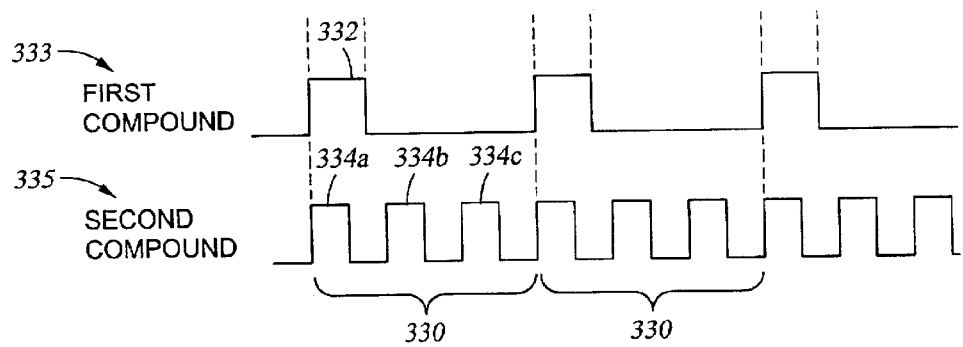
FIG. 2C is a graph of one exemplary process of the control signals for a combined mode of cyclical deposition and chemical vapor deposition.

FIG. 2C is a graph of one exemplary process of the control signals for a combined mode of cyclical deposition and chemical vapor deposition. One cycle 330 comprises introducing at least one pulse 332 of a first compound 333 by opening and closing a valve providing the first compound and introducing pulses 334 of a second compound 335 by opening and closing a valve providing the second compound. One or more pulses 334a of the second compound 335 at least partially overlap with one or more pulses 332 of the first compound 333 in which the valve providing the first compound and the valve providing the second compound are both open at the same time for a period of time. One or more pulses 334b, 334c of the second compound 335 do not overlap with one or more pulses 332 of the first compound 333 in which the valve providing the first compound is closed for a period of time while the valve providing the second compound is open. The cycle 330 may be repeated to deposit a desired thickness of the material. The pulses 332 of the first compound 333 and the pulses 334 of the second compound 335 may be delivered with or without a carrier gas. Examples of carrier gases which may be used include, but are not limited to, helium (He), argon (Ar), nitrogen ($N_2$), hydrogen ($H_2$), and mixtures thereof. In one embodiment, the pulses 332 of the first compound 333 and the pulses 334 of the second compound 335 may be dosed into a continuous flow of a purge gas. Examples of purge gases which may be used include, but are not limited to, helium (He), argon (Ar), nitrogen ($N_2$), hydrogen ($H_2$), and mixtures thereof. In other embodiments, pulses 332 of the first compound 333 and pulses 334 of the second compound 335 may be separated by pulses of a purge gas. In still other embodiments, pulses 332 of the first compound 333 and pulses 334 of a second compound 335 may be separated by pump evacuation alone. In one aspect, a first compound and a second compound are delivered at separate times to the substrate to provide a deposition process similar to cyclical deposition. In another aspect, a first compound and a second compound are delivered at the same time to the substrate to provide a deposition process similar to chemical vapor deposition. In other embodiments, a combined mode of cyclical deposition comprises providing pulses of more than two compounds.

Other embodiments of a combined mode of cyclical deposition and chemical vapor deposition are possible. For example, one cycle may comprise providing one pulse of a first compound and one pulse of a second compound in which the pulse of the first compound and the pulse of the second compound only partially overlap in time by opening a valve providing the first compound, then opening a valve providing the second compound, then closing the valve providing the first compound, and then closing the valve providing the second compound.

FIGS. 2A and 2C show the duration of pulses of compounds provided over a relative length of time, show a specific order of pulses, and show a specific number of pulses per cycle. In other embodiments, other relative lengths of time, other order of the pulses, and other number of pulses are possible.

In certain embodiments, deposition of Ti, whether by cyclical deposition, by chemical vapor deposition, or by a combined mode of deposition, comprises utilizing a titanium precursor and a reductant. The titanium precursor preferably comprises titanium tetrachloride ($TiCl_4$). Examples of other titanium containing compounds include, but are not limited to, titanium iodide ($TiI_4$), titanium bromide ($TiBr_4$), other titanium halides, tetrakis(dimethylamino)titanium (TDMAT), tetrakis(diethylamino) titanium (TDEAT), other titanium organic compounds, and derivatives thereof. The reductant comprises a hydrogen plasma. The hydrogen plasma Is preferably provided by utilizing a hydrogen gas ($H_2$). Other hydrogen containing gases which may also be used include silane ($SiH_4$), borane ($BH_3$), diborane ($B_2H_6$), triborane, among others.

In certain embodiments, deposition of $TiSi_x$, whether by cyclical deposition, by chemical vapor deposition, or by a combined mode of deposition, comprises utilizing a titanium precursor and a silicon precursor. The titanium precursor preferably comprises $TiCl_4$. Other titanium precursors may be used, such as the titanium precursors described above in regards to the deposition of Ti. The silicon precursor preferably comprises silane ($SiH_4$). Other silicon containing compounds include, but are not limited to disilane ($Si_2H_6$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), and derivatives thereof.

In certain embodiments, deposition of $TiSi_xN_y$, whether by cyclical deposition, by chemical vapor deposition, or by a combined mode of deposition, comprises utilizing a titanium precursor, a silicon precursor, and a nitrogen precursor. The titanium precursor preferably comprises titanium tetrachloride ($TiCl_4$) and the silicon precursor preferably comprises silane ($SiH_4$). Other titanium precursors and silicon precursors may be used, such as the titanium precursors and silicon precursors described above in regards to the deposition of Ti and $TiSi_x$. The nitrogen precursor preferably comprises ammonia ($NH_3$). Examples of other nitrogen precursors include, but are not limited to hydrazine ($N_2H_4$), other $N_xH_y$ compounds with x and y being integers, dimethyl hydrazine (($CH_3)_2N_2H_2$), t-butylhydrazine ($C_4H_9N_2H_3$), phenyihydrazine ($C_6H_5N_2H_3$), 2,2'-azotertbutane (($CH_3)_6C_2N_2$), ethylazide ($C_2H_5N_3$), and derivatives thereof.

In certain embodiments, deposition of TIN, whether by cyclical deposition, by chemical vapor deposition, or by a combined mode of deposition, comprises utilizing a titanium precursor and a nitrogen precursor. The titanium precursor preferably comprises titanium tetrachionde ($TiCl_4$). Other titanium precursors may be used, such as the titanium precursors described above in regards to the deposition of Ti. The nitrogen precursor preferably comprises a nitrogen plasma, $NH_3$, or combinations thereof. Examples of other nitrogen precursors include, but are not limited to hydrazine ($N_2H_4$), other $N_xH_y$ compounds with x and y being integers, dimethyl hydrazine (($CH_3)_2N_2H_2$), t-butylhydrazine ($C_4H_9N_2H_3$), phenyihydrazine ($C_6H_5N_2H_3$), 2,2'-azotertbutane (($CH_3)_6C_2N_2$), ethylazide ($C_2H_5N_3$), and derivatives thereof. Examples of other nitrogen containing gases which may also be used to generate a nitrogen plasma include, but are not limited to, $NH_3$, $N_xH_y$ with x and y being integers (e.g., hydrazine ($N_2H_4$)), a mixture of hydrogen gas ($H_2$) and nitrogen gas ($N_2$), mixtures thereof, other gases or gas mixtures containing hydrogen and nitrogen.

Referring to FIG. 1, in one embodiment, step 10, step 20, and step 30 are performed in separate chambers. In another embodiment, two or more of the steps 10, 20, 30 are performed in the same chamber. In still another embodiment, all of the steps 10, 20, 30 are performed in the same chamber.

Figure 3A:
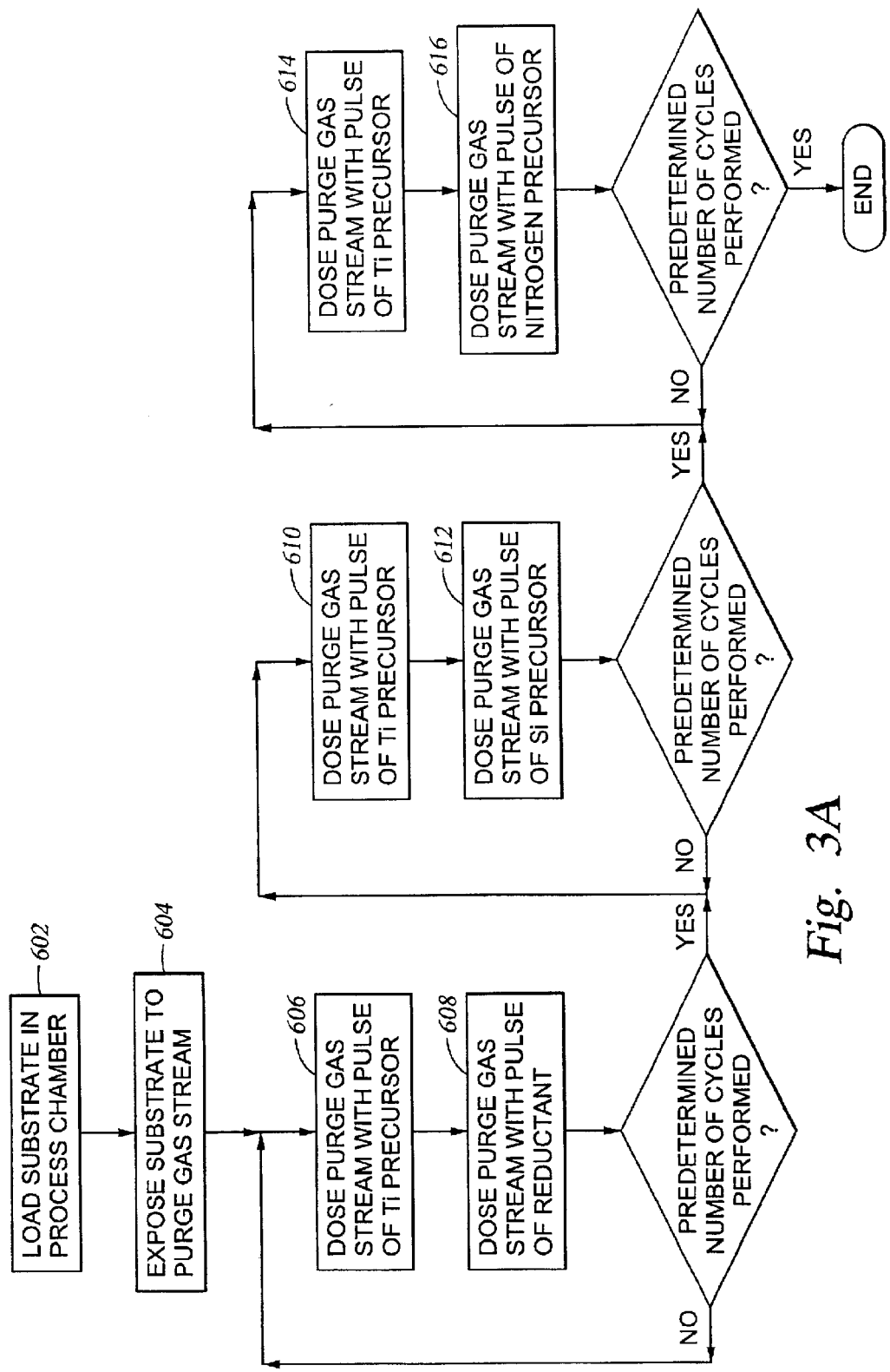
FIG. 3A is a flow chart illustrating one embodiment of a process utilizing a continuous flow of a purge gas to deposit a Ti layer, a $TiSi_x$ layer, and a TiN layer by cyclical deposition in the same chamber.

FIG. 3A is a flow chart illustrating one embodiment of a process utilizing a continuous flow of a purge gas to deposit a Ti layer, a $TiSi_x$ layer, and a TiN layer by cyclical deposition in the same chamber. As shown in step 602, a substrate is provided to the process chamber. The process chamber conditions, such as for example the substrate temperature and pressure, may be adjusted. In step 604, a purge gas stream is established within the process chamber. Referring to step 606, after the purge gas stream is established within the process chamber, a pulse of a Ti precursor, such as $TiCl_4$, is added or dosed into the purge gas stream. In step 608, after the pulse of the Ti precursor a pulse of a reductant, such as a hydrogen plasma, is dosed into the purge gas stream. Step 606 and step 608 are repeated until a predetermined number of cycles are performed to form a Ti layer. Referring to step 610, after a predetermined number of cycles of step 606 and step 608 are performed, another pulse of the Ti precursor is dosed into the purge gas stream. In step 612, after the pulse of the Ti precursor, a pulse of a Si precursor, such as a $SiH_4$, is dosed into the purge gas stream. Step 610 and step 612 are repeated until a predetermined number of cycles are performed to form a $TiSi_x$ layer. Referring to step 614, after a predetermined number of cycles of step 610 and step 612 are performed, another pulse of the Ti precursor is dosed into the purge gas stream. In step 616, after the pulse of the Ti precursor, a pulse of a nitrogen precursor, such as $NH_3$ or a nitrogen plasma, is dosed into the purge gas stream. Step 614 and step 616 are repeated until a predetermined number of cycles are performed to form a TiN layer.

Figure 3B:
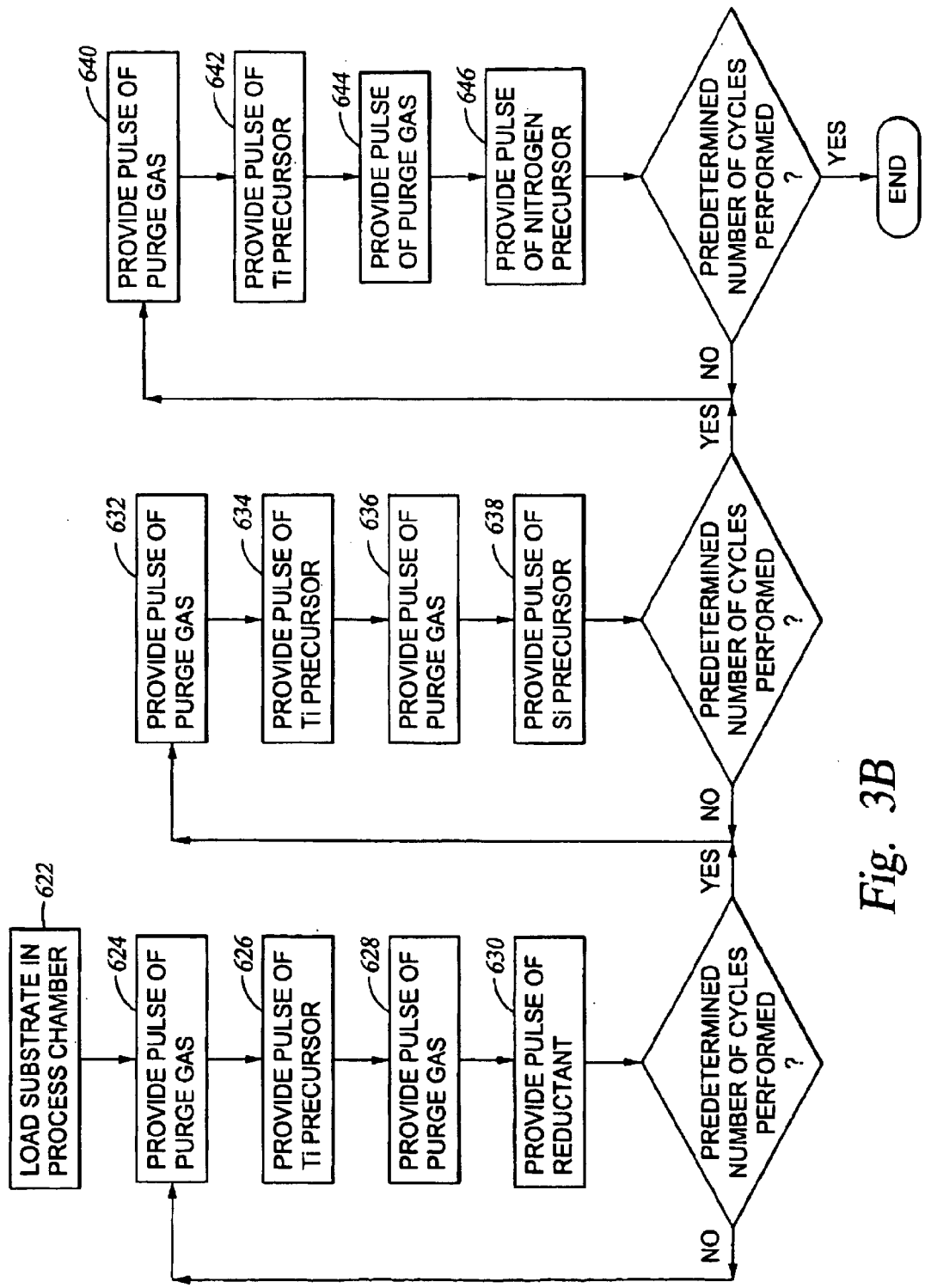
FIG. 3B is a flow chart illustrating one embodiment of a process utilizing pulses of a purge gas to deposit a Ti layer, a $TiSi_x$ layer, and a TiN layer by cyclical deposition in the same chamber.

FIG. 3B is a flow chart illustrating one embodiment of a process utilizing pulses of a purge gas to deposit a Ti layer, a $TiSi_x$ layer, and a TiN layer by cyclical deposition in the same chamber. As shown in step 622, a substrate is provided to a process chamber. The process chamber conditions, such as for example the substrate temperature and pressure, may be adjusted. In step 624, a pulse of a purge gas is provided to the process chamber. Referring to step 626 after the pulse of the purge gas, a pulse of a Ti precursor, such as $TiCl_4$, is provided to the process chamber. In step 628, after the pulse of the Ti precursor, another pulse of the purge gas is provided. In step 630, after the pulse of the purge gas, a pulse of a reductant, such as a hydrogen plasma, is provided. Steps 624, 626, 628, and 630 are repeated until a predetermined number of cycles are performed to form a Ti layer. Referring to step 632, after a predetermined number of cycles of steps 624, 626, 628, and 630 are performed, another pulse of the purge gas is provided to the process chamber. Referring to step 634, after the pulse of the purge gas, another pulse of the Ti precursor is provided to the process chamber. In step 636, after the pulse of the Ti precursor, another pulse of the purge gas is provided. In step 638, after the pulse of the purge gas, a pulse of a silicon precursor, such as silane ($SiH_4$), is provided. Steps 632, 634, 636, and 638 are repeated until a predetermined number of cycles are performed to form a $TiSi_x$ layer. Referring to step 640, after a predetermined number of cycles of steps 632, 634, 636, and 638 are performed, another pulse of the purge gas is provided to the process chamber. Referring to step 642, after the pulse of the purge gas, another pulse of the Ti precursor is provided to the process chamber. In step 644, after the pulse of the Ti precursor, another pulse of the purge gas is provided. In step 646, after the pulse of the purge gas, a pulse of a pulse of a nitrogen precursor, such as $NH_3$ or a nitrogen plasma, is provided. Steps 640, 642, 644, and 646 are repeated until a predetermined number of cycles are performed to form a TiN layer.

Figure 3C:
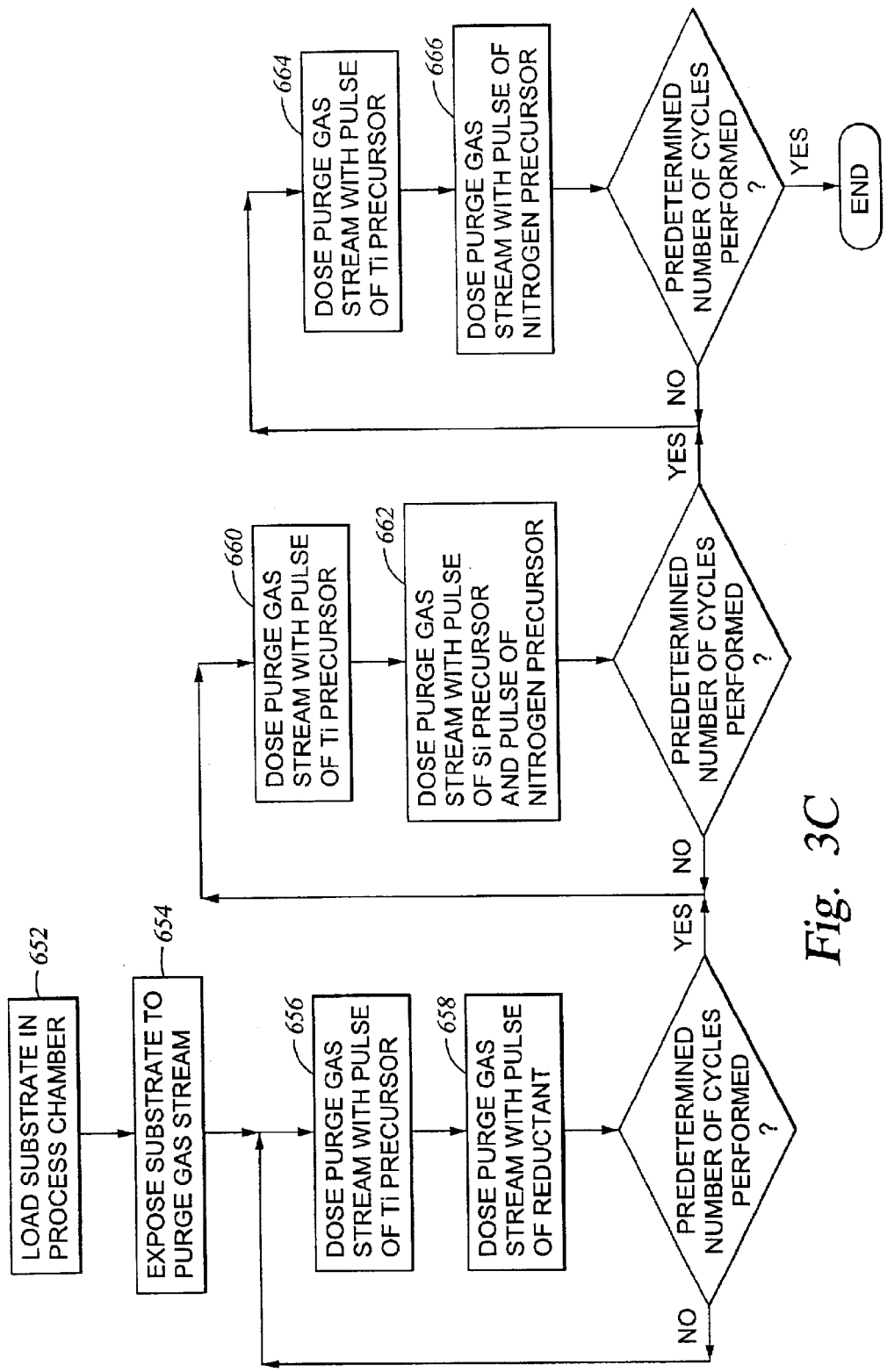
FIG. 3C is a flow chart illustrating one embodiment of a process utilizing a continuous flow of a purge gas to deposit a Ti layer, a $TiSi_xN_y$ layer, and a TiN layer by cyclical deposition in the same chamber.

FIG. 3C is a flow chart illustrating one embodiment of a process utilizing a continuous flow of a purge gas to deposit a Ti layer, a $TiSi_xN_y$ layer, and a TiN layer by cyclical deposition in the same chamber. As shown in step 652, a substrate is provided to the process chamber. The process chamber conditions, such as for example the substrate temperature and pressure, may be adjusted. In step 654, a purge gas stream is established within the process chamber. Referring to step 656, after the purge gas stream is established within the process chamber, a pulse of a Ti precursor, such as $TiCl_4$, is added or dosed into the purge gas stream. In step 658, after the pulse of the Ti precursor a pulse of a reductant, such as a hydrogen plasma, is dosed into the purge gas stream. Step 656 and step 658 are repeated until a predetermined number of cycles are performed to form a Ti layer. Referring to step 660, after a predetermined number of cycles of step 656 and step 658 are performed, another pulse of the Ti precursor is dosed into the purge gas stream. In step 662, after the pulse of the Ti precursor, a pulse of a Si precursor, such as $SiH_4$, and a pulse of a nitrogen precursor, such as $NH_3$, is dosed into the purge gas stream. The pulses of the Si precursor and the nitrogen precursor may be introduced separately or may be introduced in which the pulses at least partially overlap in time. Step 660 and step 662 are repeated until a predetermined number of cycles are performed to form a $TiSi_xN_y$ layer. Referring to step 664, after a predetermined number of cycles of step 660 and step 662 are performed, another pulse of the Ti precursor is dosed into the purge gas stream. In step 666, after the pulse of the Ti precursor, another pulse of the nitrogen precursor is dosed into the purge gas stream. Step 664 and step 666 are repeated until a predetermined number of cycles are performed to form a TiN layer.

Figure 3D:
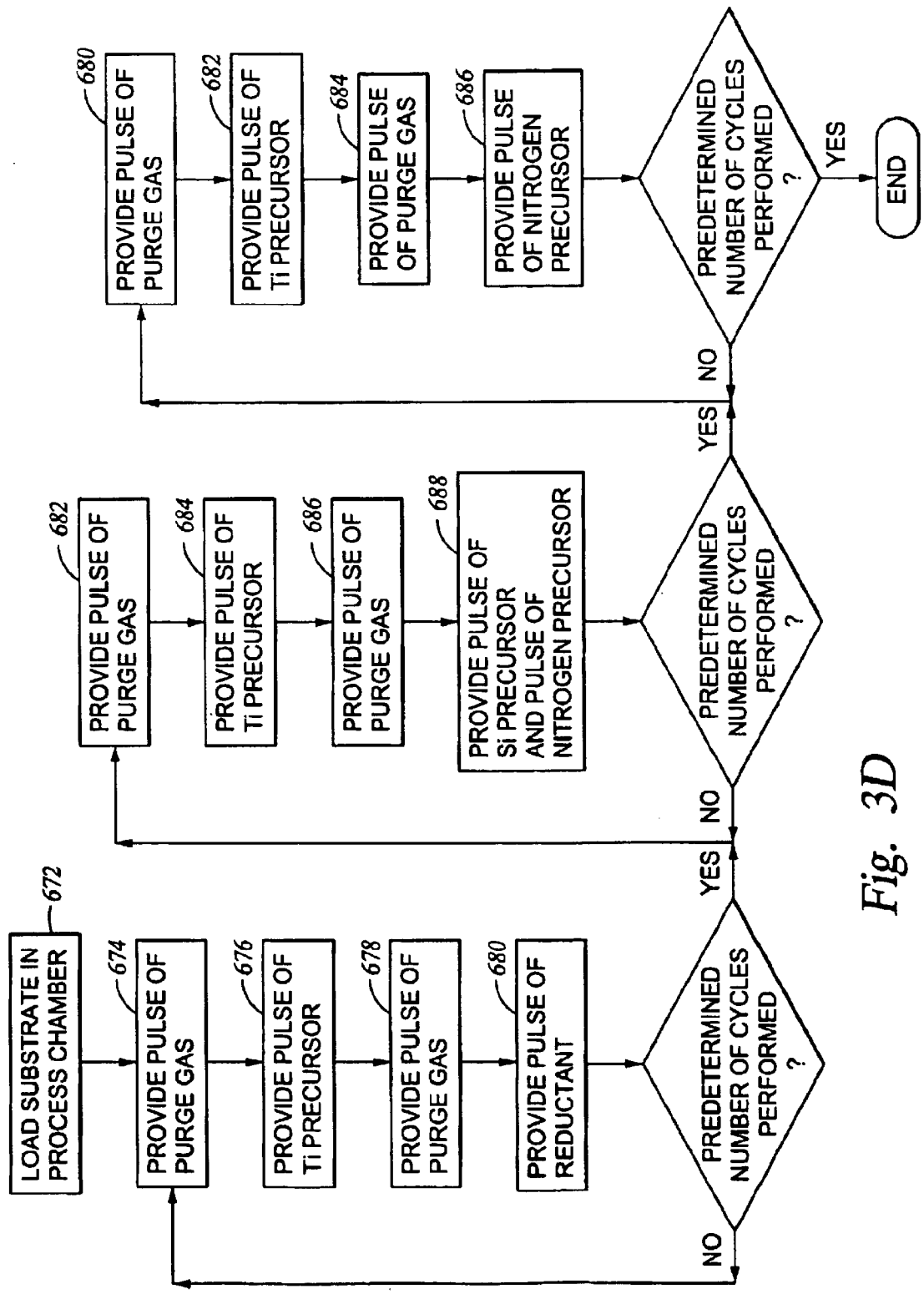
FIG. 3D is a flow chart illustrating one embodiment of a process utilizing pulses of a purge gas to deposit a Ti layer, a $TiSi_xN_y$ layer, and a TiN layer by cyclical deposition in the same chamber.

FIG. 3D is a flow chart illustrating one embodiment of a process utilizing pulses of a purge gas to deposit a Ti layer, a $TiSi_xN_y$ layer, and a TiN layer by cyclical deposition in the same chamber. As shown in step 672, a substrate is provided to a process chamber. The process chamber conditions, such as for example the substrate temperature and pressure, may be adjusted. In step 674, a pulse of a purge gas is provided to the process chamber. Referring to step 676 after the pulse of the purge gas, a pulse of a Ti precursor, such as $TiCl_4$, is provided to the process chamber. In step 678, after the pulse of the Ti precursor, another pulse of the purge gas is provided. In step 680 after the pulse of the purge gas, a pulse of a reductant, such as a hydrogen plasma, is provided. Steps 674, 676, 678, and 680 are repeated until a predetermined number of cycles are performed to form a Ti layer. Referring to step 682, after a predetermined number of cycles of steps 674, 676, 678, and 680 are performed, another pulse of the purge gas is provided to the process chamber. Referring to step 684, after the pulse of the purge gas, another pulse of the Ti precursor is provided to the process chamber. In step 686, after the pulse of the Ti precursor, another pulse of the purge gas is provided. In step 688, after the pulse of the purge gas, a pulse of a silicon precursor, such as silane ($SiH_4$), and a pulse of a nitrogen precursor, such as ammonia ($NH_3$), is provided. The pulses of the Si precursor and the nitrogen precursor may be introduced separately or may be introduced in which the pulses at least partially overlap in time. Steps 682, 684, 686, and 688 are repeated until a predetermined number of cycles are performed to form a $TiSi_xN_y$ layer. Referring to step 690, after a predetermined number of cycles of steps 682, 684, 686, and 688 are performed, another pulse of the purge gas is provided to the process chamber. Referring to step 692, after the pulse of the purge gas, another pulse of the Ti precursor is provided to the process chamber. In step 694, after the pulse of the Ti precursor, another pulse of the purge gas is provided. In step 696, after the pulse of the purge gas, another pulse of a pulse of a nitrogen precursor is provided. Steps 690, 692, 694, and 696 are repeated until a predetermined number of cycles are performed to form a TiN layer.

In regards to FIGS. 3A–3D, the same Ti precursor is preferably used to deposit a Ti layer, a $TiSi_x/TiSi_xN_y$ layer, and a TiN layer. For example, $TiCl_4$ may be used to deposit a Ti layer, a $TiSi_x/TiSi_xN_y$ layer, and a TiN layer. FIGS. 3A–3D show the deposition of a Ti layer, a $TiSi_x/TiSi_xN_y$ layer, and a TiN layer in a single chamber. In other embodiments, deposition of a Ti layer, a $TiSi_x/TiSi_xN_y$ layer, and a TiN layer may be performed in more than one chamber. For example, two or more chambers may be used to deposit a Ti layer, a $TiSi_x/TiSi_xN_y$ layer, and a TiN layer. FIGS. 3A–3D show deposition of a Ti layer, a $TiSi_x/TiSi_xN_y$ layer, and a TiN layer by cyclical deposition. In other embodiments, each layer may be deposited by the same or different deposition technique selected from the group including cyclical deposition, chemical vapor deposition, and a combined mode of cyclical deposition and chemical vapor deposition.

Figure 4:
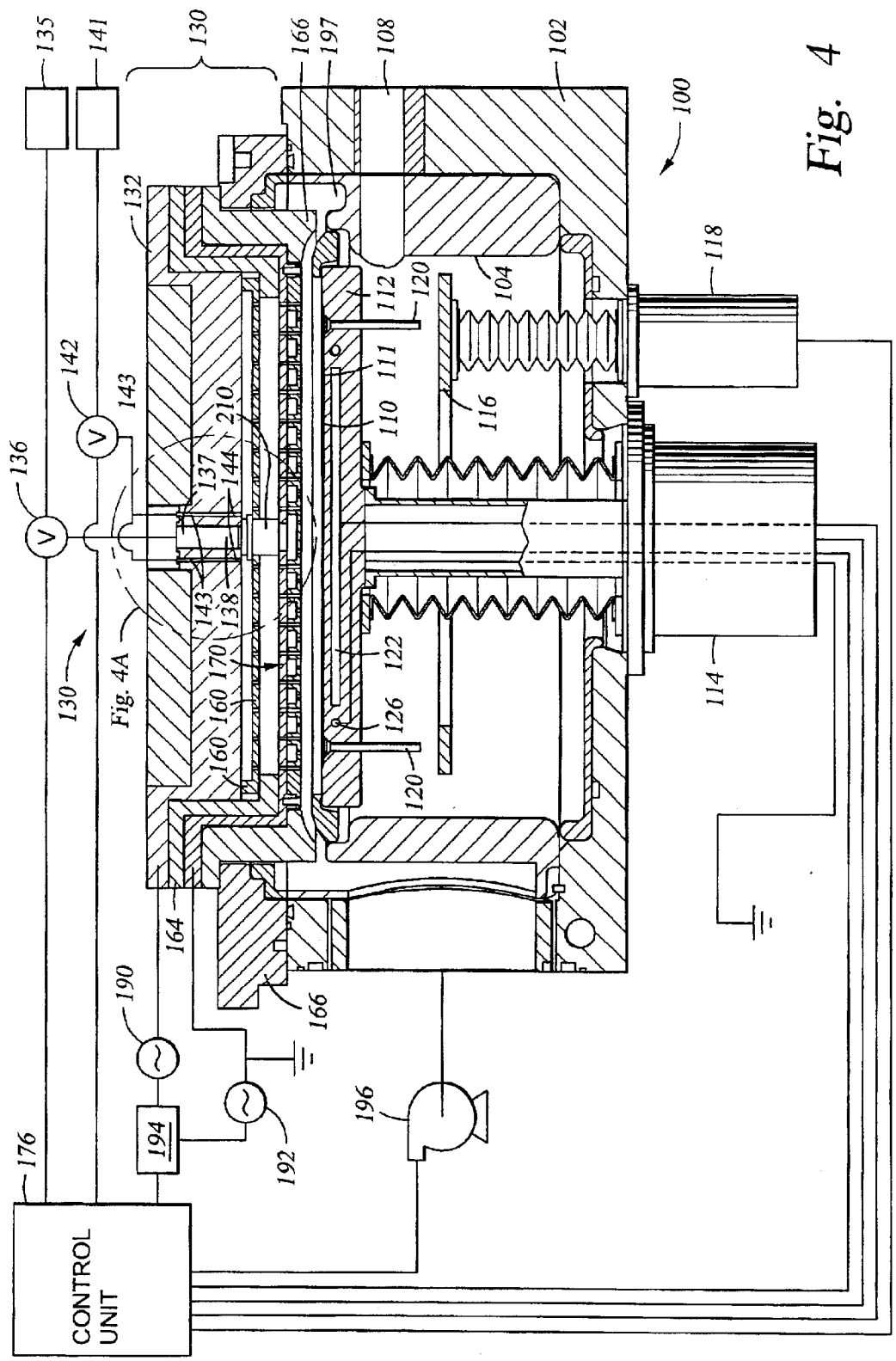
FIGS. 4 and 4A are drawings of an exemplary processing chamber that may be used to perform cyclical deposition.
Figure 4A:
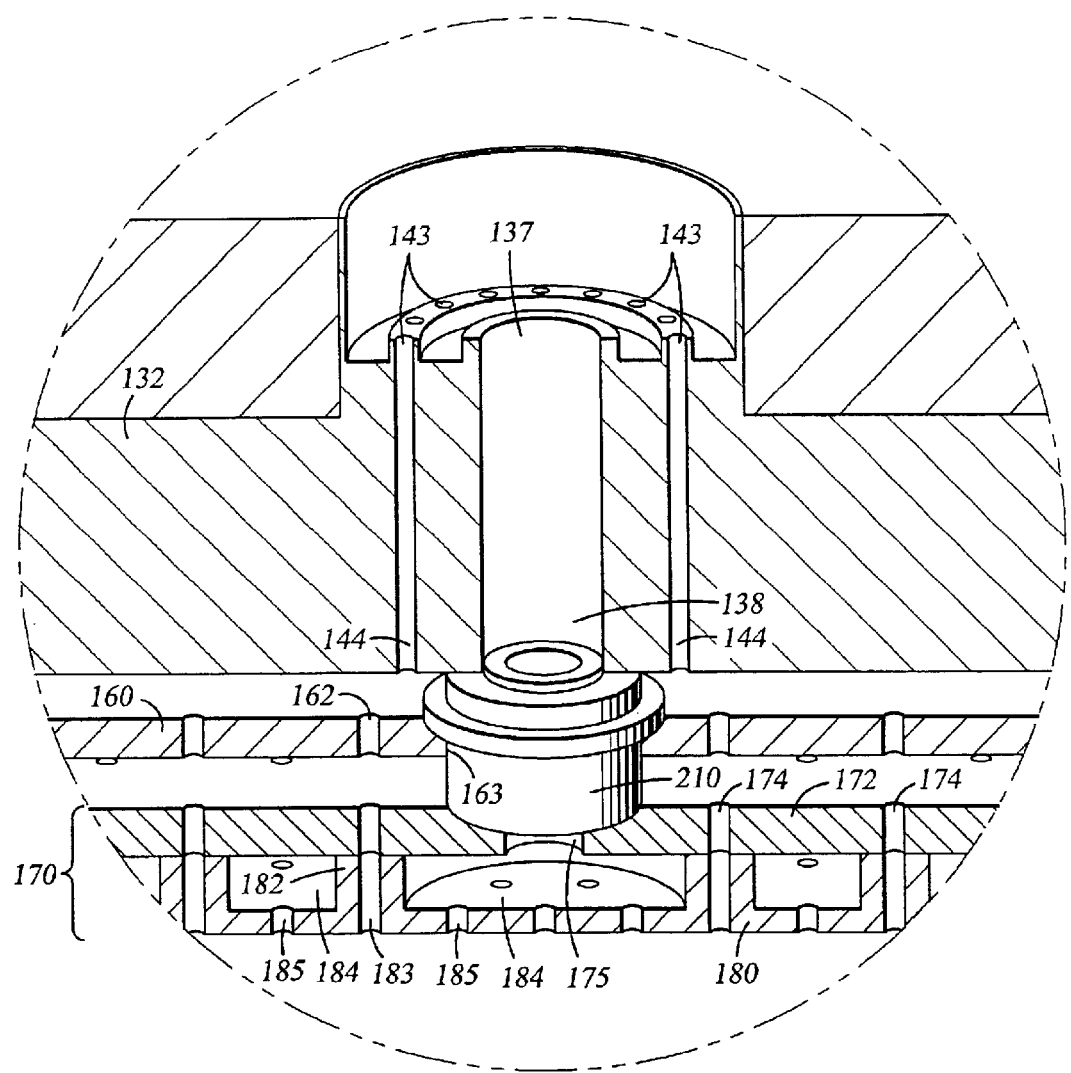

FIGS. 4 and 4A are drawings of an exemplary processing chamber 100 that may be used to perform cyclical deposition, chemical vapor deposition, or a combined mode of cyclical deposition and chemical vapor deposition. Other chambers may also be used. The chamber 100 comprises a chamber body 102 including a substrate support 112 having a substrate receiving surface 111 to support a substrate 110. The chamber may be adapted to heat the substrate 110, such as by a heated substrate support or by using heat lamps. A gas distribution system 130 is disposed at an upper portion of the chamber body 102 to provide a gas to the chamber 100. The gas distribution system 130 comprises a gas box 132, a top shower plate 160 positioned below the gas box 132, and a bottom shower plate 170 positioned below the top shower plate 160.

FIG. 4A is a schematic partial cross-sectional view of a portion of the gas box 132, a portion of the top shower plate 160, and a portion of the bottom shower plate 170 of FIG. 4. In reference to FIGS. 4 and 4A, the gas box 132 comprises a central gas channel 137 and a plurality of outer gas channels 143. The central gas channel 137 provides one discrete path for the flow of one or more gases through the gas box 132 while the outer channels 143 provides another discrete path for the flow of one or more gases through the gas box 132. The central gas channel 137 is coupled to a first gas source 135 (FIG. 4) through valve 136 (FIG. 4). The central gas channel 137 has a first gas outlet 138 and is adapted to deliver a first gas from the first gas source 135 to a gas conduit 210. The term "gas" as used herein is intended to mean a single gas or a gas mixture. The outer gas channels 143 are coupled to a second gas source 141 (FIG. 4) through valve 142 (FIG. 4). The outer gas channels 143 have second gas outlets 144 and are adapted to deliver a second gas from the second gas source 141 to the top shower plate 160. Preferably, the second gas outlets 144 of the outer gas channels 143 are adapted to deliver the second gas proximate a central portion of the top shower plate. Gas sources 135, 141 may be adapted to store a gas or liquid precursor in a cooled, heated, or ambient environment. The valves 136, 142 control delivery of the first gas and the second gas into the central gas channel 137 and the outer gas channels 143 respectively and may be electrically controlled valves, pneumatically controlled valves, piezoelectric valves, or other suitable valves. In another embodiment, a third gas source may be coupled to the outer gas channels 143 to provided a third gas to the top shower plate 160 or may be coupled to the central gas channel 137 to provided a third gas to the gas conduit 210.

Referring to FIG. 4A, the top shower plate 160 has a plurality of holes 162 to accommodate a gas flow therethrough from the outer gas channels 143 of the gas box 132 to the bottom shower plate 170. Referring to FIG. 4, the top shower plate 160 is separated from the bottom shower plate 170 by an insulator 164 to electrically insulate the top shower plate 160 from the bottom shower plate 170. The bottom shower plate 170 may be disposed on an upper portion of the chamber body 102, such as on a lid rim 166 disposed on the chamber body 102. The lid rim 166 comprises an insulating material to electrically insulate the bottom shower plate 170 from the chamber body 102. The gas conduit 210 is disposed through an aperture 163 in the top shower plate 160 and is disposed on the bottom shower plate 170. The gas conduit 210 is made of an insulating material to prevent electrical coupling of the top shower plate 160 and the bottom shower plate 170.

As shown in FIG. 4A, the bottom shower plate 170 comprises a first piece 172 connected to a second piece 180. The first piece 172 has a plurality of holes 174 to provide a flow of a gas therethrough. The second piece 180 comprises a plurality of columns 182 having column holes 183 formed therethrough and a plurality of grooves 184 having groove holes 185 formed therethrough. The top surface of the columns 182 are connected to the bottom surface of the first piece 172 so that the column holes 183 align with the holes 174 of the first piece 172. Therefore, one discrete passageway is provided through the holes of the first piece 172 and through the column holes 183 of the columns 182 to deliver a gas flow from the top shower plate 160 to the substrate receiving surface 111. The aperture 175 is formed through the first piece 172 and aligns with the grooves on the second piece 180. Therefore, another discrete passageway is provided through the aperture 175 of the first piece 172 and through the grooves 184 and groove holes 185 of the second piece 180 to deliver a gas flow from the gas conduit 210 to the substrate receiving surface 111.

Referring to FIG. 4, a power source 190 may be coupled to the top shower plate 160 through the gas box 132 to provide a power electrode and the bottom shower plate 170 may be grounded to provide a ground electrode. The power source 190 may be an RF or DC power source. An electric field may be established between the top shower plate 160 and the bottom shower plate 170 to generate a plasma from the gases introduced between the top shower plate 160 and the bottom shower plate 170. The power source 190 may be coupled to a matching network 194 to control delivery of power to the power source 190. The power source 190 may selectively provide power to selectively perform plasma and non-plasma processes.

In another embodiment, the bottom shower plate 170 may be optionally coupled to a power source 192 in addition to the power source 190 coupled to the top shower plate 160 and may be selectively powered or grounded. The power sources 190 and 192 are coupled to the matching network 194 to control delivery of any amount of power to the power source 190 and to control delivery of any amount of power to the power source 192. In one aspect, the matching network 194 may control the delivery of power to the power sources 190, 192 so that the top shower plate 160 and the bottom shower plate 170 are at the same or substantially the same potential. With a grounded substrate support 112, the top shower plate 160 and the bottom shower plate 170 act as one electrode and the substrate support 112 acts as another electrode of spaced apart electrodes in which an electric field is established between the bottom shower plate 170 and the substrate support 112 to generate a plasma from the gases introduced between the bottom shower plate 170 and the substrate support 112. Therefore, power may be selectively provided to power sources 190, 192 to selectively generate a plasma between the top shower plate 160 and the bottom shower plate 170 or between the bottom shower plate 170 and the substrate support 112. Thus, the power sources 190, 192 may selectively provide power to selectively perform plasma and non-plasma processes.

A vacuum system 196 is in communication with a pumping channel 197 formed in the chamber body 102 to evacuate gases from the chamber 100 and to help maintain a desired pressure or a desired pressure range inside the chamber 100. Control unit 176 may be coupled to the chamber 100 to control processing conditions.

Soak with a Silicon Precursor

Figure 5:
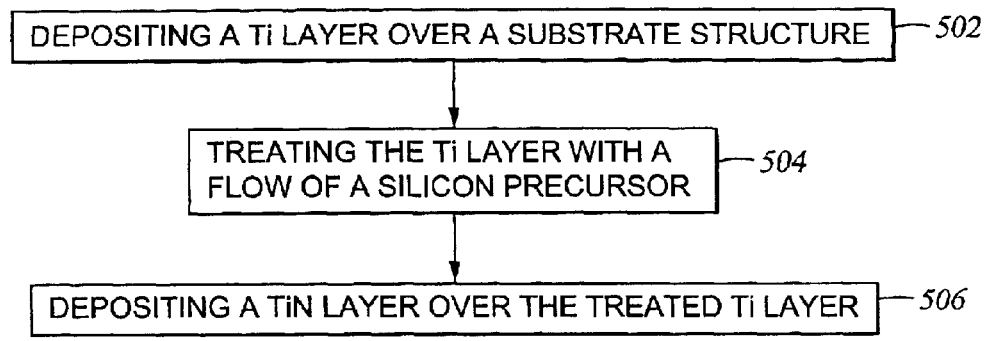
FIG. 5 is a flow chart illustrating another embodiment of a process of integrating a Ti layer and a TiN layer by soaking a Ti layer with a flow of a silicon precursor prior to deposition of a TiN layer thereover.

FIG. 5 is a flow chart illustrating another embodiment of a process of integrating a Ti layer and a TiN layer by soaking a Ti layer with a flow of a silicon precursor prior to deposition of a TiN layer thereover. In step 502, a Ti layer is deposited over a substrate structure. The Ti layer may be deposited by methods including, but are not limited to, chemical vapor deposition, cyclical deposition, physical vapor deposition, and combinations thereof. For example, the Ti layer may be deposited by chemical vapor deposition or cyclical deposition by utilizing a titanium precursor, such as titanium tetrachloride ($TiCl_4$), and a reducing agent, such as a hydrogen plasma. Examples of other titanium containing compounds include, but are not limited to, titanium iodide ($TiI_4$), titanium bromide ($TiBr_4$), other titanium halides, tetrakis(dimethylamino)titanium (TDMAT), tetrakis (diethylamino) titanium (TDEAT), other titanium organic compounds, and derivatives thereof. The hydrogen plasma is preferably provided by utilizing a hydrogen gas ($H_2$). Other hydrogen containing gases which may also be used include silane ($SiH_4$), borane ($BH_3$), diborane ($B_2H_6$), triborane, among others.

Referring to step 504, after the Ti layer is deposited, the Ti layer is treated with a soak with a silicon precursor by flowing in the silicon precursor into a process chamber. The silicon precursor is preferably silane ($SiH_4$). Other silicon precursors may also be used, such as disilane ($Si_2H_6$), and less preferably, dichlorosilane, or silicon tetrachloride. The silicon precursor may be flowed in with a carrier gas, such as a helium gas (He), an argon gas (Ar), hydrogen gas ($H_2$), nitrogen gas ($N_2$), other suitable gases, and combinations thereof. The substrate is preferably maintained at a substrate temperature of about 550° C. or less, preferably about 500° C. or less, and more preferably about 450° C. or less. Not wishing to be bound by theory, it is believed that a soak of the Ti layer with a silicon precursor converts at least a portion of the Ti layer to titanium suicide ($TiSi_x$). It is believed that the $TiSi_x$ helps protect the interface between the Ti layer and a subsequently deposited TiN layer resulting in improved adhesion of the TiN layer thereover. It is believed that a soak with a silicon precursor performed at a heater temperature of about 550° C. or less reduces the formation of polysilicon or amorphous silicon which would be undesirable due to the higher resistance of polysilicon or amporphous silicon in comparison to $TiSi_x$.

In step 506, after the $SiH_4$ soak, a TiN layer is deposited over the treated Ti layer. The TiN layer may be deposited by such methods, with include, but are not limited to, chemical vapor deposition, cyclical deposition, physical vapor deposition, and combinations thereof. For example, the TiN layer may be deposited by chemical vapor deposition or cyclical deposition by utilizing a titanium precursor, such as titanium tetrachloride ($TiCl_4$), and a nitrogen precursor, such as ammonia ($NH_3$) or a nitrogen plasma. When a titanium halide is used to form the TiN layer, it is believed that the $TiSi_x$ formed during the soak with a silicon precursor protects the Ti layer from etching or attack from the halogen in the titanium halide, such as chlorine from $TiCl_4$, used during chemical vapor deposition or cyclical deposition of the TiN layer.

Examples of other titanium containing compounds which may be used to form the TIN layer include, but are not limited to, titanium iodide ($TiI_4$), titanium bromide ($TiBr_4$), other titanium halides, tetrakis(dimethylamino)titanium (TDMAT), tetrakis(diethylamino) titanium (TDEAT), other titanium organic compounds, and derivatives thereof. Examples of other nitrogen precursors which may be used to form the TIN layer include, but are not limited to hydrazine ($N_2H_4$), other $N_xH_y$ compounds with x and y being integers, dimethyl hydrazine (($CH_3$)$_2N_2H_2$), t-butylhydrazine ($C_4H_9N_2H_3$), phenylhydrazine ($C_6H_5N_2H_3$), 2,2'-azotertbutane (($CH_3$)$_6C_2N_2$), ethylazide ($C_2H_5N_3$), and derivatives thereof. Examples of other nitrogen containing gases which may also be used to generate a nitrogen plasma to form the TiN layer include, but are not limited to, $NH_3$, $N_xH_y$ with x and y being integers (e.g., hydrazine ($N_2H_4$)), a mixture of hydrogen gas ($H_2$) and nitrogen gas ($N_2$), mixtures thereof, other gases or gas mixtures containing hydrogen and nitrogen.

In one embodiment, step 502, step 504, and step 506 may each be performed in separate chambers. In another embodiment, two or more of step 502, step 504, and step 506 may be performed in the same chamber. For example, deposition of a Ti layer and a soak of the Ti layer with a silicon precursor may be performed in the same chamber. In another example, a soak of a Ti layer with a silicon precursor and deposition of a TiN layer may be performed in the same chamber. In still another example, deposition of a Ti layer, a soak of the Ti layer with a silicon precursor, and deposition of a TiN over the treated Ti layer may be performed in the same chamber. Preferably, two or more of step 502, step 504, and step 506 are performed in the same chamber to increase throughput of processing the substrates.

Processing chambers which may be used to deposit a Ti layer, perform a soak with a silicon precursor, and/or deposit a TiN layer include the chamber as described in reference to FIGS. 4 and 4A. Other chambers may also be used such as the processing chamber described in U.S. patent application (Ser. No. 10/032,293) entitled "Chamber Hardware Design For Titanium Nitride Atomic Layer Deposition," filed on Dec. 21, 2001; the processing chamber described in U.S. patent application (Ser. No. 10/016,300) entitled "Lid Assembly For A Processing System To Facilitate Sequential Deposition Techniques," filed on Dec. 12, 2001, which claims priority to U.S. Provisional Application Ser. No. 60/305,970 filed on Jul. 16, 2001; and the process chamber disclosed in U.S. patent application (Ser. No. 10/032,284) entitled "Gas Delivery Apparatus and Method For Atomic Layer Deposition," filed on Dec. 21, 2001, which claims priority to U.S. Provisional Patent Application (Serial No. 60/346,086) entitled "Method and Apparatus for Atomic Layer Deposition," filed on Oct. 26, 2001, which are all incorporated by reference in their entirety to the extent not inconsistent with the present disclosure.

One exemplary process of treating a Ti layer with a soak of a silicon precursor comprises flowing in silane ($SiH_4$) into a chamber, such as chamber 100 described in reference to FIG. 4, at a flow rate between about 5 sccm and about 500 sccm, preferably about 100 sccm. Silane may be introduced with a carrier gas, such as a helium gas (He), an argon gas (Ar), hydrogen gas ($H_2$), nitrogen gas ($N_2$), other suitable gases, and combinations thereof. The chamber may be maintained at a pressure between about 0.1 torr to about 50 torr, preferably about 3 torr. The substrate is preferably maintained at a substrate temperature about 550° C. or less, preferably about 500° C. or less, and more preferably about 450° C. or less. The $SiH_4$ soak is preferably carried out for a time period between about 5 seconds and about 60 seconds. In general, treatment time will depend on the flow rate of $SiH_4$ and the pressure of the chamber.

Applications

Figure 6:
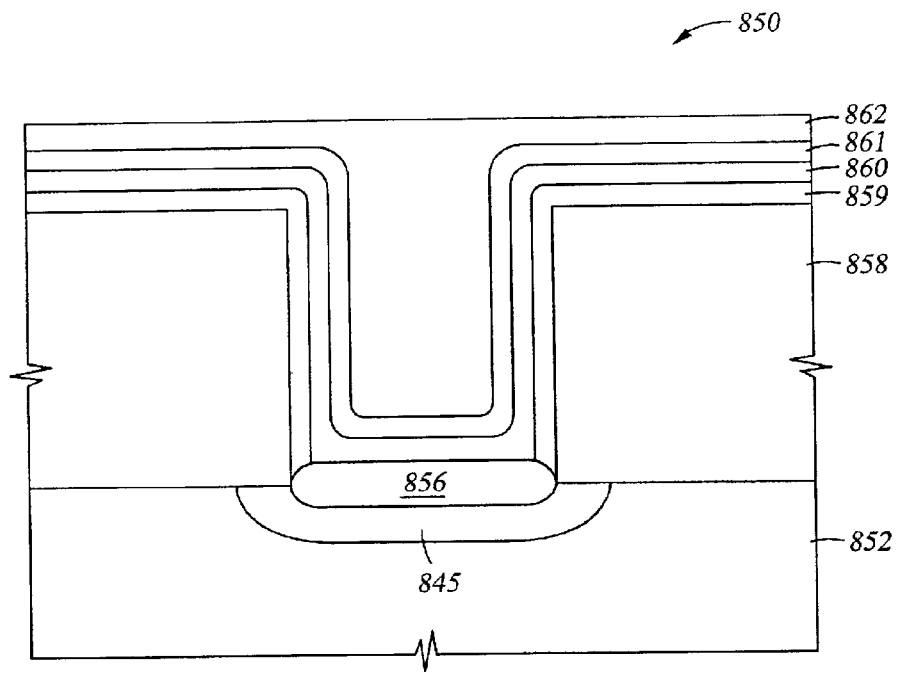
FIG. 6 is a schematic cross-sectional view of one embodiment of an exemplary application of an integrated Ti/TiN film stack.

FIG. 6 is a schematic cross-sectional view of one embodiment of an exemplary application of an integrated Ti/TiN film stack formed by the process of FIG. 1 or FIG. 5. As shown in FIG. 6, a doped source/drain region 845 may be formed over a substrate 852. The substrate 852 may be a semiconductor substrate, such as a silicon substrate. A dielectric layer 858, such as a silicon dioxide layer or a low-k dielectric layer, may be formed over the substrate 852. One example of a low-k dielectric layer is an oxidized organosilane layer or an oxidized organosiloxane layer described in more detail in U.S. Pat. No. 6,348,725, issued Feb. 19, 2002, which is incorporated by reference herein. The dielectric layer 858 may be patterned and etched to form an aperture. A titanium layer 859 may be deposited over the aperture to form titanium silicide 856 in situ or in an annealing step. A passivation layer 860 comprising $TiSi_x$, $TiSi_xN_y$, or combinations thereof is deposited over the titanium layer 859 or formed by a soak of the titanium layer 859 with a silicon precursor. A TiN layer 861 is deposited over the passivation layer 860. A conductive layer 862 comprising a conductive material, such as tungsten, copper, aluminum, and combinations thereof, may be deposited over the TiN layer 861.

Figure 7:
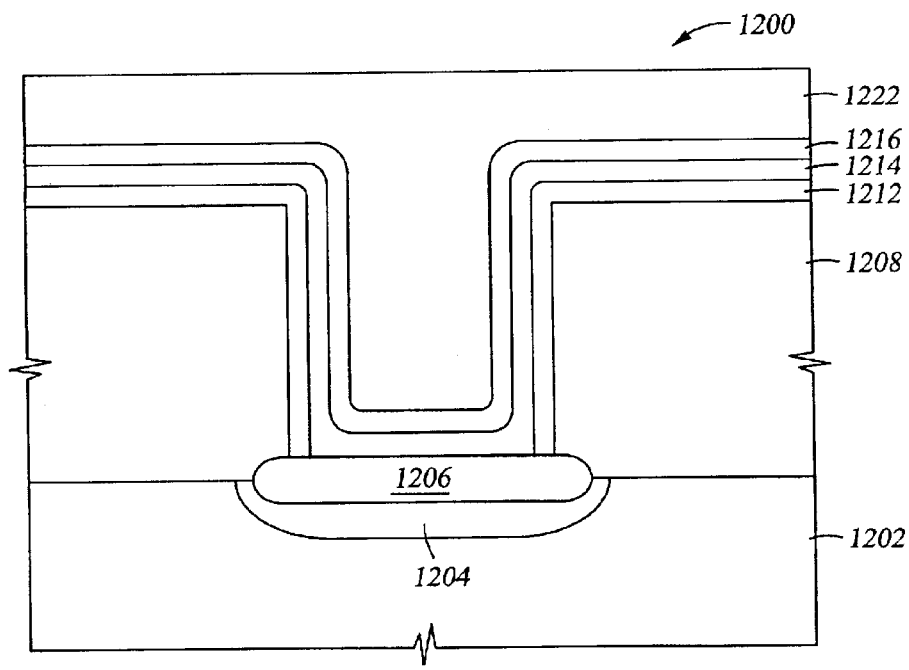
FIG. 7 is a schematic cross-sectional view of another embodiment of an exemplary application of an integrated Ti/TiN film stack.

FIG. 7 is a schematic cross-sectional view of another embodiment of an exemplary application of an integrated Ti/TiN film stack formed by the process of FIG. 1 or FIG. 5. As shown in FIG. 7, the film stack 1200 includes an underlying substrate 1202, such as a semiconductor substrate, and includes a doped source/drain region 1204. A metal silicide layer 1206, such as a titanium silicide layer, nickel silicide layer, cobalt silicide layer, or tungsten silicide layer, may be formed over the region 1204. A dielectric layer 1208, such as a silicon dioxide layer or a low-k dielectric layer, may be formed over the metal silicide layer 1206. One example of a low-k dielectric layer is an oxidized organosilane layer or an oxidized organosiloxane layer described in more detail in U.S. Pat. No. 6,348,725, issued Feb. 19, 2002, which is incorporated by reference herein. The dielectric layer 1208 may be patterned and etched to form an aperture exposing the metal silicide layer 1206. A titanium layer 1212 may be formed over the aperture. A passivation layer 1214 comprising $TiSi_x$, $TiSi_xN_y$, or combinations thereof is deposited over the titanium layer 1212 or formed by a soak of the titanium layer 1212 with a silicon precursor. A titanium nitride layer 1216 may be formed over the passivation layer 1214. A conductive layer 1222 comprising a conductive material, such as tungsten, copper, aluminum, and combinations thereof, may be deposited over the titanium nitride layer 1216. Other applications of the integrated Ti/TiN film stack are possible.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
   (a) providing one or more cycles of a first set of compounds, comprising delivering at least one pulse of a titanium precursor and at least one pulse of a reductant that at least partially overlap in time;
   (b) providing one or more cycles of a second set of compounds, comprising introducing the titanium precursor and a silicon precursor; and
   (c) providing one or more cycles of a third set of compounds, comprising introducing the titanium precursor and a nitrogen precursor.

2. The method of claim 1, wherein providing the one or more cycles of the second set of compounds further comprises introducing the nitrogen precursor.

3. The method of claim 2, wherein the nitrogen precursor comprises ammonia.

4. The method of claim 1, wherein the pulses of the titanium precursor and the pulses of the reductant of the first set of compounds are dosed into a continuous flow of a purge gas.

5. The method of claim 1, wherein steps (a) through (c) are performed in a single process chamber.

6. The method of claim 1, wherein steps (a) and (b) are performed in a single process chamber.

7. The method of claim 1, wherein steps (b) and (c) are performed in a single process chamber.

8. The method of claim 1, wherein steps (a) and (c) are performed in a single process chamber.

9. The method of claim 1, wherein the titanium precursor comprises a titanium halide.

10. The method of claim 9, wherein the titanium precursor comprises titanium tetrachloride.

11. A method of processing a substrate, comprising:
    (a) providing one or more cycles of a first set of compounds, comprising introducing a titanium precursor and a reductant;
    (b) providing one or more cycles of a second set of compounds, comprising introducing at least one pulse of the titanium precursor and at least one pulse of a silicon precursor that at least partially overlap in time; and
    (c) providing one or more cycles of a third set of compounds, comprising introducing the titanium precursor and a nitrogen precursor.

12. The method of claim 11, wherein the pulses of the titanium precursor and the pulses of the silicon precursor of the second set of compounds are dosed into a continuous flow of a purge gas.

13. A method of processing a substrate, comprising:
    (a) providing one or more cycles of a first set of compounds, comprising introducing a titanium precursor and a reductant;
    (b) providing one or more cycles of a second set of compounds, comprising introducing the titanium precursor and a silicon precursor; and
    (c) providing one or more cycles of a third set of compounds, comprising introducing at least one pulse of the titanium precursor and at least one pulse of a nitrogen precursor that at least partially overlap in time.

14. The method of claim 13, wherein the pulses of the titanium precursor and the pulses of the nitrogen precursor of the third set of compounds are dosed into a continuous flow of a purge gas.

15. A method of processing a substrate, comprising:
    (a) providing one or more cycles of a first set of compounds, comprising introducing a titanium precursor and a reductant;
    (b) providing one or more cycles of a second set of compounds, comprising introducing the titanium precursor and a silicon precursor; and
    (c) providing one or more cycles of a third set of compounds, comprising introducing the titanium precursor and a nitrogen precursor; and performing steps (a) through (c) in separate process chambers.

16. A method of processing a substrate, comprising:
    (a) depositing a titanium layer over a surface of a substrate;
    (b) treating the titanium layer with a soak with a silicon precursor at a substrate temperature of about 450° C. or less to form a treated titanium layer; and
    (c) depositing a titanium nitride layer over the treated titanium layer.

17. The method of claim 16, where the silicon precursor comprises silane.

18. The method of claim 16, wherein steps (a) through (c) are performed in separate process chambers.

19. The method of claim 16, wherein steps (a) through (c) are performed in a single process chamber.

20. The method of claim 16, wherein two or more steps (a) through (b) are performed in a single process chamber.

21. The method of claim 16, wherein depositing a titanium layer is performed by a deposition technique selected from the group consisting of chemical vapor deposition, cyclical deposition, physical vapor deposition and combinations thereof.

22. The method of claim 16, wherein depositing a titanium layer is performed by utilizing a titanium halide and a hydrogen plasma.

23. The method of claim 16, wherein depositing a titanium nitride layer is performed by a deposition technique selected from the group consisting of chemical vapor deposition, cyclical deposition, physical vapor deposition, and combinations thereof.

24. The method of claim 16, wherein depositing a titanium nitride layer is performed utilizing a titanium halide and a nitrogen precursor.

* * * * *

UNITED STATES PATENT AND TRADEMARK OFFICE
CERTIFICATE OF CORRECTION

PATENT NO. : 6,911,391 B2  
APPLICATION NO. : 10/118664  
DATED : June 28, 2005  
INVENTOR(S) : Michael X. Yang, Toshio Itoh and Ming Xi It is certified that error appears in the above-identified patent and that said Letters Patent is hereby corrected as shown below:

Column 5, Line 36: Change "$(TiI_4)$" to --$(TiI_4)$--  
Column 5, Line 41: Change "Is" to --is--  
Column 6, Line 4: Change "phenyihydrazine" to --phenylhydrazine--  
Column 6, Line 7: Change "TIN" to "TiN"  
Column 6, Line 19: Change "phenyihydrazine" to --phenylhydrazine--  
Column 7, Line 29: Delete the second instance of "pulse of a"  
Column 8, Line 35: Delete "of a pulse"  
Column 10, Line 53: Change "TIN" to --TiN--  
Column 10, Line 65: Change "$(TiI_4)$" to --$(TiI_4)$--  
Column 11, Line 20: Change "suicide" to --silicide--  
Column 11, Line 31: Change "with" to --which--  
Column 11, Line 45: Change "TIN" to --TiN--  
Column 11, Line 46: Change "$(TiI_4)$" to --$(TiI_4)$--  
Column 11, Line 51: Change "TIN" to --TiN--

<u>In the Claims</u>  
Column 14, Claim 20, Line 59: Change "(b)" to --(c)--

Signed and Sealed this

Nineteenth Day of September, 2006

JON W. DUDAS  
*Director of the United States Patent and Trademark Office*

UNITED STATES PATENT AND TRADEMARK OFFICE
CERTIFICATE OF CORRECTION

PATENT NO. : 6,911,391 B2
APPLICATION NO. : 10/118664
DATED : June 28, 2005
INVENTOR(S) : Michael X. Yang, Toshio Itoh and Ming Xi It is certified that error appears in the above-identified patent and that said Letters Patent is hereby corrected as shown below:

<u>In the Specification</u>

Column 5, Line 36: Change "(TiI$_4$)" to --(TiI$_4$)--

Column 5, Line 41: Change "Is" to --is--

Column 6, Line 4: Change "phenyihydrazine" to --phenylhydrazine--

Column 6, Line 7: Change "TIN" to --TiN--

Column 6, Line 19: Change "phenyihydrazine" to --phenylhydrazine--

Column 7, Line 29: Delete the second instance of "pulse of a"

Column 8, Line 35: Delete "of a pulse"

Column 10, Line 53: Change "TIN" to --TiN--

Column 10, Line 65: Change "(TiI$_4$)" to --(TiI$_4$)--

Column 11. Line 20: Change "suicide" to --silicide--

Column 11, Line 31: Change "with" to --which--

Column 11, Line 45: Change "TIN" to --TiN--

Column 11, Line 46: Change "(TiI$_4$)" to --(TiI$_4$)--

Column 11, Line 51: Change "TIN" to --TiN--

UNITED STATES PATENT AND TRADEMARK OFFICE
CERTIFICATE OF CORRECTION

| | |
|---|---|
| PATENT NO. | : 6,911,391 B2 |
| APPLICATION NO. | : 10/118664 |
| DATED | : June 28, 2005 |
| INVENTOR(S) | : Michael X. Yang, Toshio Itoh and Ming Xi |

It is certified that error appears in the above-identified patent and that said Letters Patent is hereby corrected as shown below:

<u>In the Claims</u>

Column 14, Claim 20, Line 59: Change "(b)" to --(c)--

Signed and Sealed this

Seventh Day of November, 2006

JON W. DUDAS
*Director of the United States Patent and Trademark Office*